United States Patent
Icove et al.

(10) Patent No.: US 9,244,133 B2
(45) Date of Patent: Jan. 26, 2016

(54) HANDHELD DEVICES AND STRUCTURES TO DETECT STICKY DEVICES HAVING MAGNETS

(71) Applicant: Icove and Associates, LLC, Knoxville, TN (US)

(72) Inventors: David J. Icove, Knoxville, TN (US); Carl T. Lyster, Knoxville, TN (US); David M. Banwarth, Dayton, MD (US); Sandra K. Wesson, Little Rock, AR (US)

(73) Assignee: Icove and Associates, LLC, Knoxville, TN (US)

( * ) Notice: Subject to any disclaimer, the term of this patent is extended or adjusted under 35 U.S.C. 154(b) by 272 days.

(21) Appl. No.: 14/062,484

(22) Filed: Oct. 24, 2013

(65) Prior Publication Data

US 2014/0236514 A1    Aug. 21, 2014

Related U.S. Application Data

(63) Continuation-in-part of application No. 13/006,023, filed on Jan. 13, 2011, now Pat. No. 8,594,979.

(51) Int. Cl.
*G01R 33/07* (2006.01)
*G01R 33/09* (2006.01)
(Continued)

(52) U.S. Cl.
CPC .............. *G01R 33/072* (2013.01); *G01V 3/081* (2013.01); *G01V 3/15* (2013.01); *H04N 7/18* (2013.01)

(58) Field of Classification Search
CPC ........... G01V 3/08; G01V 3/165; G01V 3/26; G01V 3/38; G01R 33/0005; G01R 33/0047; G01R 33/0094
USPC .......................................................... 702/65
See application file for complete search history.

(56) References Cited

U.S. PATENT DOCUMENTS

| 4,100,491 A | 7/1978 | Newman, Jr. |
| 4,859,944 A | 8/1989 | Webb |

(Continued)

FOREIGN PATENT DOCUMENTS

| GB | 2248692 | 4/1992 | |
| GB | WO 2005012054 A1 * | 2/2005 | .............. F21L 14/04 |
| WO | WO2005012054 | 2/2005 | |

OTHER PUBLICATIONS

Mims III, Forrest M., Electronic Sensor Circuits & Projects, vol. III, The Hall Effect, pp. 68-96, Master Publishing Inc., 2007.

(Continued)

*Primary Examiner* — Gregory J Toatley
*Assistant Examiner* — Terence Stifter, Jr.
(74) *Attorney, Agent, or Firm* — Cameron LLP

(57) ABSTRACT

Apparatus and methods for detecting concealed personal security threats may comprise conventional mirrors and less conventional arrays of Hall-effect sensors and/or magnetometers, preferably at least two axis or three axis sensors or sensors mounted back-to-back. The concealed personal security threats may comprise, for example, sticky devices consisting of geographic position sensors for covertly broadcasting motor vehicle location data, of so-called Improvised Explosive Devices (IED's) which may be covertly or openly affixed to, for example, the undercarriages of motor vehicles using strong magnets and later exploded, the former giving away private location information, the latter causing damage to the motor vehicles to which they are affixed and sticky containers for hiding contraband among other "sticky devices." Magnetic fields detected by, for example, arrays of Hall-effect sensors and the like may be quantified and stored in processor memory as a vehicle magnetic field signature. A processor receiving magnetic field data collected by the arrays may retrieve and subtract known signatures from acquired magnetic field data for a given vehicle to obtain location for a magnetic field on the vehicle that may be of potential interest as a risk.

20 Claims, 17 Drawing Sheets

(51) Int. Cl.
*H04N 7/18* (2006.01)
*G01V 3/08* (2006.01)
*G01V 3/15* (2006.01)

(56) References Cited

U.S. PATENT DOCUMENTS

| | | | |
|---|---|---|---|
| 5,491,475 | A | 2/1996 | Rouse et al. |
| 5,959,792 | A | 9/1999 | Ibrahim |
| 6,317,048 | B1 * | 11/2001 | Bomya ................. B60R 21/013 180/274 |
| 6,342,845 | B1 | 1/2002 | Hilliard et al. |
| 6,586,937 | B2 * | 7/2003 | Goodman ................. G01V 3/15 324/326 |
| 6,771,064 | B2 | 8/2004 | Leibowitz |
| 6,853,194 | B2 | 2/2005 | Nelson |
| 7,227,466 | B2 | 6/2007 | Nelson |
| 7,584,673 | B2 | 9/2009 | Shimizu |
| 7,639,178 | B1 | 12/2009 | Mulbrook et al. |
| 2002/0154032 | A1 * | 10/2002 | Hilliard ................. G08G 1/042 340/933 |
| 2008/0048635 | A1 * | 2/2008 | Hughes ................. B21J 15/28 324/67 |
| 2008/0292211 | A1 | 11/2008 | Frantz |
| 2009/0290757 | A1 * | 11/2009 | Mian ................. G06K 9/00214 382/104 |
| 2010/0102809 | A1 * | 4/2010 | May ....................... G01V 3/081 324/244 |
| 2010/0321010 | A1 * | 12/2010 | van Veldhoven ....... B82Y 25/00 324/225 |
| 2012/0062223 | A1 * | 3/2012 | Olsson ................. G01R 33/10 324/252 |

OTHER PUBLICATIONS

Woodaman et al., "A Decision Analytic Approach for Measuring the Value of Counter-IED Solutions at the Joint Improvised Explosive Device Defeat Organization," George Mason University, 2009, 8 pages.
Ramsden, Edward; Hall-Effect Sensors; Theory and Applications; Elsevier; 2006; excerpts, 13 pages.
Allegro Microsystems, LLC; Hall-Effect IC Applications Guide; 27701-AN, Rev. 2; 40 pages; 2013.

* cited by examiner

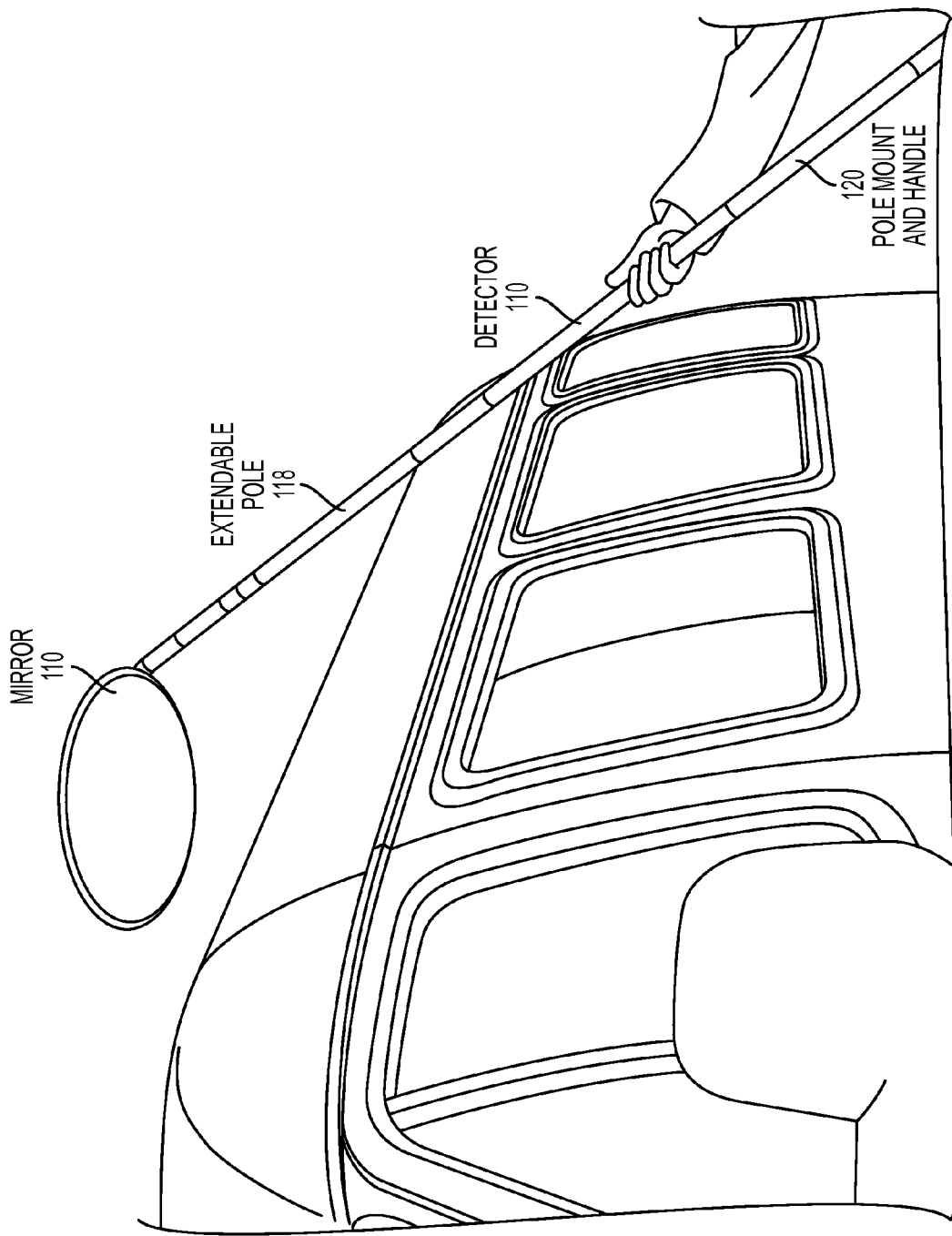

HANDHELD DEVICES AND STRUCTURES TO DETECT STICKY DEVICES HAVING MAGNETS

This application is a continuation-in-part of U.S. patent application Ser. No. 13/006,023 filed Jan. 13, 2012, no allowed, entitled "Handheld and Imbedded Devices to Detect Sticky Devices Using Magnets" of David J. Icove and Carl T. Lyster incorporated herein by reference as to its entire contents.

TECHNICAL FIELD

Embodiments relate to the technical field of apparatus and methods for detecting concealed personal security threats, for example, sticky devices consisting, for example, of geographic position sensors for covertly broadcasting motor vehicle location data and of so-called Improvised Explosive Devices (IED's) which may be covertly or openly affixed to, for example, the undercarriages of motor vehicles using strong magnets and later exploded, the former giving away private location information without the knowledge of a driver or passengers and the latter causing damage to the motor vehicles to which they are affixed and potentially harming a driver, passengers and nearby persons, and, in particular, for detecting a magnetic field surrounding the sticky devices.

BACKGROUND

The situation of living and operating in a free nation in which covert activities ma invade upon personal privacy and, at the same time, a hostile national environment during high terror risk or wartime conditions creates an environment where, for example, vehicles become an available target for espionage and surveillance activists, for terrorists and for insurgents to typically place magnetically affixed location finders and even bombs to motor vehicle, for example, to undercarriages, bumpers, wheel wells, roofs, engine compartments and quarter panels. Due to their affinity to strong magnetic adherence to these metal parts, the bomb devices are called "sticky IEDs." The location trackers with associated Global Positioning System radio frequency broadcast are called "sticky location finders." Also, containers are often used with magnets to permit the containers to be concealed under the vehicle body or in wheel wells. For example, small containers with affixed permanent magnets are used to contain a vehicle ignition/lock key so that a driver, not having the key and the vehicle being locked, may, knowing the location of the container, obtain the key and drive the vehicle. Other containers using magnets may be used to contain illegal drugs, contraband, valuable documents, money and the like. Such a device may be referred to herein as a "sticky container." A "sticky device" is used herein to refer to any of the above. Other "sticky" devices may come to mind to one of ordinary skill in the art.

Sticky IED devices have been known to exist since at least the year 2000 and their use has been increasing. Rigged with magnets so that they will adhere to the undersides of automobiles and armored vehicles, sticky IED's are often detonated by remote control or with timers. Consequently, sticky IED's (and also sticky location finders) may be covertly placed at one point in time. Sticky IED devices may be activated once the car is moved. The sticky IED's then may be guaranteed to have at least one victim operating the vehicle. According to sources quoted on Dec. 3, 2010 via National Public Radio, currently 100 IED's are detonated each month in Iraq. The number previously was at 50 per month. In the month of November, 2010, the number of sticky IED's was 45. According to Ahmed Mawla, an explosives disposal instructor in Iraq, during the most painful times in Iraq, the number of IED's detonated reached fifty per day. Also, as of December, 2010, National Public Radio alleges that as many as 2196 deaths of US service members are attributable to IED's.

The sticky location finder is activated and can continuously monitor and broadcast vehicle location data as the vehicle moves in real time via radio frequency channels. Other initiation devices consist of movement detection mechanisms that activate the GPS unit (to save battery) or to destroy the targeted vehicle when it is started and then moved. Magnetic components of sticky IED's, sticky location finders and sticky containers may consist of imported components including, more importantly variable magnetic field characteristics and alloy compositions, for example, ceramic magnets versus AlNiCo (aluminum, nickel, cobalt) versus SmCo (samarium-cobalt) versus NdFeb (neodymium) or other permanent magnets of different alloy compositions and percentage weights.

Sticky containers may be used by rental car companies to hide keys to vehicles left on city streets for use by drivers needing vehicles that are available for rent by the hour or day. A car owner may use a sticky container to hide a key so that a co-owner, knowing the location may find the key and use it. At times, such intended placement of a magnetic container at a particular location may become unknown just as it may be the intention to use a sticky container to intentionally hide, for example, illegal drugs. Consequently, there may be a need for a magnetic field sensor for detecting such sticky containers.

The responsibility for detecting/knowing a location of these sticky devices typically rests, first, with the vehicle driver or owner. When vehicles enter compounds, security personnel, typically use mirrors to examine undercarriages and other metal portions of motor vehicles. Referring to FIG. 1A, there is shown a drawing of a known mirror detector 100 held by a user 160. The detector may comprise in combination a flashlight 115 for shining on a mirror 110 in order to illuminate an undercarriage of a vehicle 150. Detector 100 typically is formed as a pole mirror mount and handle 120 on wheels 140 so that user 160 may twist and maneuver the mirror to visually identify any unusual devices that may be affixed to the undercarriage.

In order to view above a vehicle and with reference to FIG. 1B, a detector 110 may be light-weight and have a mirror 110 mounted on an extendible pole 118 and carried and passed across a top of a vehicle when the vehicle arrives at a security check point using the extendible pole mount and handle 120 (handle not shown but see FIG. 1A). A teo-handed grip may be useful for lifting a mirror. These methods of vehicle examination are not infallible since they rely on human discretion to look for, identify, and remove these devices. Most of these sticky devices are camouflaged so as to not be easily seen, for example, by using black surface paint, tar, undercoating and other materials so as to blend in with the car surface. Consequently, mirrors 110 are not perfectly effective.

Carl V. Nelson et al. for Johns Hopkins University has performed research in the field of detecting and identifying metal targets. U.S. Pat. No. 6,853,194 describes an electromagnetic target discriminator sensor system and method for detecting and identifying metal targets. A prior art system describe by FIG. 1 suggests a pulse transmitter and receiver coil for determining the existence of a metal target by inducing an eddy current in the target. Such a system has an obvious disadvantage in that, by inducing a current (or voltage), a user of the depicted detector may trigger a target device to actuate and have disastrous consequences for the user of the equipment. Nevertheless, Nelson persists in utilizing a wireloop transmitter and a wireloop receiver for, for example, detecting a buried, metal target bomb in his '194 patent disclosure and drawings. U.S. Pat. No. 7,227,466 describes the use of an expendable metal detector that may be in the form of a hand-thrown or guided missile that may be launched toward an improvised explosive device (IED). Once the device lands, the tip may be buried next to the IED and magnetometers actuated. The missile tip may contain an impact switch for activating first and second magnetometers spaced from one another in the missile. In this manner, the magnetic fields detected by the magnetometers may be differentiated at a difference amplifier and the result transmitted by telemetry to a decision station. Clearly, the use of a missile with differential analysis may help to locate the sticky device while preserving the safety of deploying personnel.

UK published patent application GB 2 248 692 published Apr. 14, 1992 to John Bagshaw discloses a magnetic anomaly detector having a plurality of magnetic flux sensors distributed over an area and a means for calculating magnetic field intensity within the sensor area and so determine a location of the anomaly. US published patent application US 2010/0102809 published Apr. 29, 2010 to Wayne May is similar in providing a plurality of sensing arrays 100 and a real time display 109 for displaying, for example, a located improvised explosive device. These devices suffer from a problem of more simply corresponding the arrays to their respective displays. For example, May suggests calculating outputs, ground state registration, normalizing the output and so on. Moreover, the array may comprise 12 sensors per FIG. 2 to cover 600 cm or 6 meters—a very long array approximating more than 18 feet.

In the field of automobile detection and identification, it is known to obtain and compare an induction signature of a motor vehicle with a stored induction signature and so identify the motor vehicle from U.S. Pat. No. 6,342,845 of Hilliard et al. and U.S. Pat. No. 7,771,064 of Leibowitz et al. A plurality of successive induction measurements or an induction signature for a given vehicle passively captured as the vehicle passes over a blade sensor in a lane of a road may classify the vehicle (for example, as a truck or car) and even identify the vehicle. Typically, the entire vehicle passes over the blade sensor which may be buried in a road surface. As the vehicle passes over the blade sensor, the signature is captured over the time it takes for the vehicle to pass over the blade sensor.

In the field of automotive vehicle maintenance (including flying vehicles such as helicopters), it is known from U.S. Pat. No. 4,100,491 to provide a soft iron core pole piece which may be magnetized by a magnetic field. The magnetized soft iron core causes engine oil particles of the engine to adhere to the polarized magnet. As engine particles accumulate on a probe portion for mounting in an engine oil flow line, an electronic control circuit identities the accumulation of engine particles in oil (dirty oil) and provides a green (clean oil), yellow (oil caution) and red (dirty oil) indication to a driver or one responsible for engine maintenance. A feature of the circuit is the application of a brief alternating current to the soft iron core to remove residual magnetism (degauss to make the indicator green again), for example, after the engine oil is changed.

Furthermore, besides magnetometers and soft iron core detection circuits. Hall-effect sensors are known for use, for example, in determining the angular velocity of engines by detecting a magnetic field with each turn of an engine shaft. Edward Ramson, in his book, *Hall-Effect Sensors*, Elsevier, 2006, provides a thorough explanation of the use of Hall-effect sensors. Ransom includes chapters providing exemplary linear Hall-effect sensor circuits for, for example, head-on sensing of magnets. However, Ramson explains that Hall-effect sensors are notoriously variable in terms of their magnetic field detection characteristics. A typical remnant induction or flux density B present in a closed ring in a saturated state for a typical ceramic magi may be 3850 Gauss. For an AlNiCo magnet, a range in B may be from 8200 to 12,800 Gauss and for NdFeB up to 13,500 Gauss. Hall-effect sensors are north and south pole magnetic field sensitive on/off binary devices operative at a relatively high sensor level point and turn off at a relatively low level of gauss and different polarity. Magnetic field strength diminishes with the square of the distance. So the closer any magnetic field detector is to a magnet of a given polarity, the more likely the detector will turn on. Temperature also impacts both the residual level of gauss in a permanent magnet and also impacts the characteristics of the field detector.

Other devices are known such as chromatic cameras for detecting small differences in color variation. Image segmentation analysis is known for comparing an image with a known image and detecting an anomaly. Moreover, radio frequency transmission detectors (typically involving wide band antennae covering a large range of frequencies) may be utilized to detect radio frequency transmission to/from either a location finder device or emanating from a poorly shielded radio frequency transceiver used to detonate a sticky IED.

In view of the above, there is clearly a need in the art for improved systems and methods for detecting the presence of sticky devices, for example, of the GPS, IED or container type so that they may be safely deactivated and removed from the vehicles on which they are found.

SUMMARY

Specific example embodiments of apparatus and methods disclosed provide for an instrument to assist in the inspection of concealed security threats consisting of magnetized improvised explosive devices, known as sticky IEDs, which cling to the undersides of motor vehicles, sticky UPS devices used for surveillance purposes and sticky containers. IED devices are typically placed by insurgents and terrorists whose mission is to kill, maim, or terrorize the passengers and nearby individuals. The same or variations on specific example embodiments, according to the present disclosure, may also be used to detect other types of magnetically affixed devices, including global positioning systems used to surreptitiously track the vehicle, illegal substances, embargoed materials, hazardous chemicals and materials, and hazardous chemical vapors or materials. In addition, this instrument can also be used to search within any contained space, such as railroad boxcars, aircraft passenger, cargo, and luggage compartments, liquid cargo containers such as tank cars, tractor trailers, ships, and storage tanks. Embodiments may preferably involve the use of passive reception of electro-magnetic energy of any kind to avoid inadvertent actuation or detonation. Active transmission of energy is preferably avoided, even light energy. Nevertheless, one embodiment may involve a known mirror system per FIG. 1 modified to further include magnetic field sensors, optical chromatic scanning and camera image capture and passive radio frequency reception in combinations selected for the application.

A method for inspecting these vehicles may consist of an embodiment consisting of various arrangements of Hall-effect sensor devices having one or more axes as explained further below. A known source of inexpensive Hall-effect sensors is Allegro Microsystems LLC with headquarters in Worcester, Mass. Hall-effect sensors are transducers that will vary its output voltage in response to changes in magnetic field. Hall sensors are used for proximity switching, positioning, speed detection, and current sensing applications. A preferable Hall-effect sensor is one of the linear output type where the output varies linearly with the input. The Hall-effect sensor may operate as an analogue transducer, directly returning a voltage. Digital binary to analog converters are used with, for example, a plurality of Hall-effect sensors operative at selectably different sensed values of magnetic field in gauss to provide the analog output. With a known magnetic field, its distance from the singular Hall sensor plate can be determined by the square of the distance equation in combination with distance calculations, for example, made from automatic camera focusing optical systems. When using groups of sensors operating at different gaussian ranges and environmental temperatures, the relative position of the magnet can also be deduced.

A disadvantage of a Hall-effect transducer is that, in its simplest form, it is sensitive to a magnetic field in only one axis and field polarity. On the other hand, Hall-effect transducers may be fabricated to be sensitive as a two-axis or three-axis sensor. In one embodiment, two Hall-effect sensors are used back-to-back to improve range and overcome the problem of not being able to detect fields of either North or South polarity. For example, one may place a pair of devices on a single silicon die by aligning their structures at 90° to one another for a two-axis sensor and/or 180° back to back. In a similar manner, three transducers on a single die may form a three-axis sensor. Through experimentation with known Hall-effect sensors, Hall-effect sensors may be arranged back-to-back to increase range. When connected to an operational amplifier and LED's, the Hall-effect back-to-back sensors may be used to distinguish a magnet field regardless of the field's polarity. A typical range for magnetic field sensing less background noise, by a single Hall-effect sensor used with an operational amplifier and a single LED display per sensor is approximately less than six inches to detect a magnetic field of approximately 3000 Gauss. With back-to-back Hall-effect sensing the range is increased to between six and seven inches and with the advantage of detecting either N or S polarity. A prototype of three Hall-effect circuits spaced on a mirror (center and periphery) has been constructed and shown to exhibit a 10 cm range per single Hall-effect sensor and ample coverage is achieved with a 12 to 18 inch diameter mirror. Consequently, in embodiments, a Hall-effect sensor as further described herein may be separated from another similar sensor by less than about nine inches. With back-to-back and/or multiple axis Hall-effect sensing or hybrid magnetometer sensing, the range may be increased.

On the other hand, Hall-effect circuits have advantages over either a magnetometer or an iron core magnetic field sensor. For one, a Hall-effect sensor need not be de-gaussed before it is re-used. A magnetometer cannot distinguish between a magnet and other metallic objects that may be attached to an undercarriage. A magnetometer wand does not exhibit a metallic profile. A magnetometer may introduce its own magnetic field and may be therefore unsafe in the presence of an IED with its own sensors for detecting a magnetic field and detonating. A Hall-effect sensor does not emanate a magnetic field and therefore is intrinsically safer.

Extremely strong magnets are needed to conform with the sticky IED, container or location finder devices and quickly and semi-permanently cause it to adhere to a surface on the vehicle. A common form of magnet used to affix sticky IEDs is known as an Alnico magnet, which consists of an iron alloy combined with aluminum (Al), nickel (Ni) and cobalt (Co), copper, and sometimes titanium. Alnico magnets produce magnetic field strength at their poles as high as 1500 Gauss (0.15 Tesla), or about 3000 times the strength of the Earth's magnetic field. Anisotropic alloys generally have greater magnetic capacity in a preferred orientation than isotropic types. Alnico's permanence (Br) may exceed 12,000 G (1.2 T), producing a strong magnetic flux in closed magnetic circuit. Other permanent magnets are known for use in sticky devices including, but not limited to, ceramic magnets, SmCo magnets and NdFe magnets. In embodiments of the present invention, a selectable sensitivity may be 1000-6000 Gauss and fields above 6000 Gauss.

Forensically, it is possible to track the source of a sticky device if recovered, even if recovered in pieces after it has exploded, from the composition of the magnet. A recovered portion of a magnet may be reverse-engineered to determine its original size, its gaussian output, its metallic or ceramic composition and from these factors, its origin or location of manufacture. It is demonstrated that a portable embodiment of the invention such as a wand or mirror embodiment may be used to discover magnetic bomb fragments at an explosion site.

These and other features of embodiments of a hand-held and/or embedded device and/or above an open box-like or reverse U-shaped frame and/or cylindrical or paddle-shaped wand for detecting sticky devices with minimal harm to the user using Hall-effect sensor circuits will be discussed herein with reference to the drawings and the following detailed description thereof.

BRIEF DESCRIPTION OF THE DRAWINGS

FIG. 1B shows a similar line drawing of a prior art extendible telescoping pole-mounted mirror for visually observing the roof of a vehicle such as a panel van or other truck which is taller than the user.

FIG. 8 represents a simple diode circuit for use with the circuit of FIG. 7 whereby the Hall-effect sensor 705 is now represented as Hall-effect switch 805 for operating, for example, a light emitting diode $D_1$ to signal the presence of a magnetic field when the switch is switched on.

DETAILED DESCRIPTION

Figure 9A:
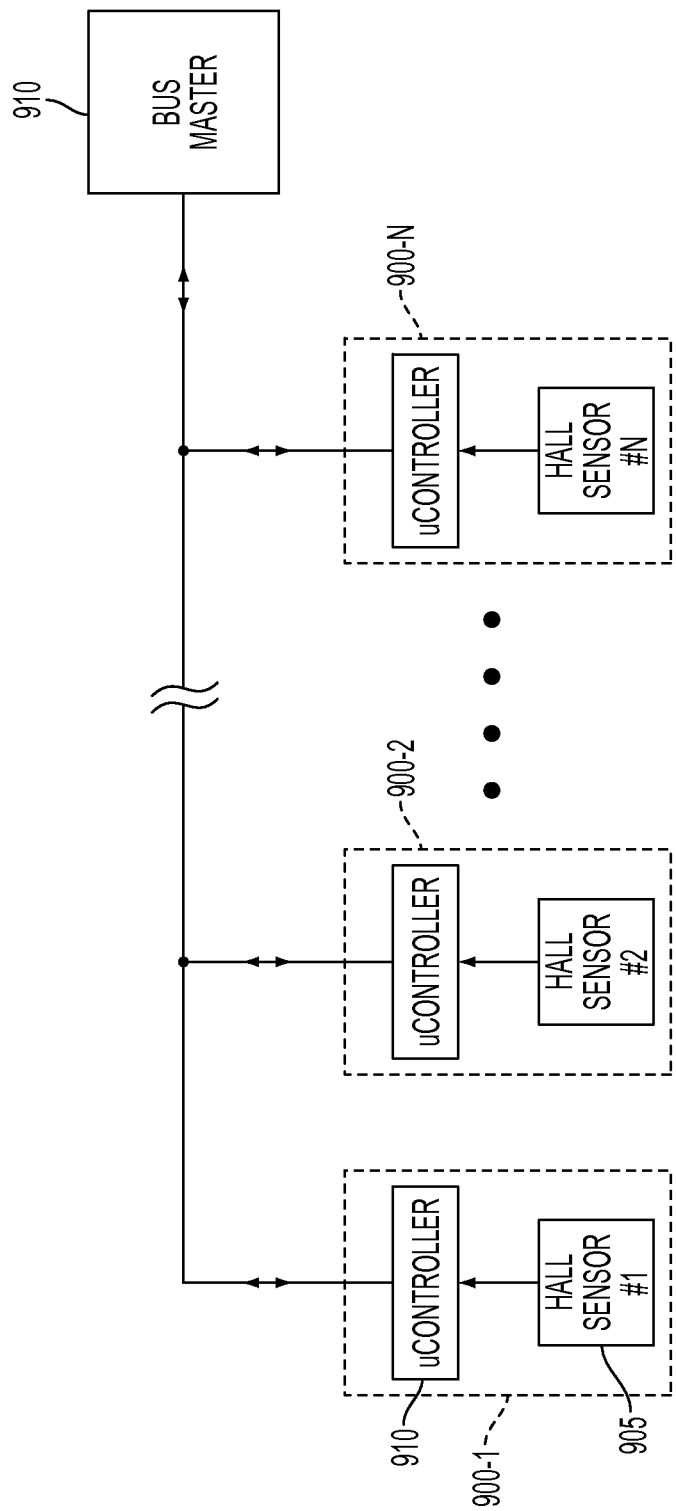
FIG. 9A represents a plurality of Hall-effect sensors per FIG. 7 or 8 connected by a bus and each having a microcontroller where the sensors may trigger at different values of magnetic field strength in gauss in order to detect a range of different magnetic fields and magnets, for example, ceramic and AlNiCo magnets or a row of sensors per FIG. 3A, 3B, 4 or 5 among others.
Figure 9B:
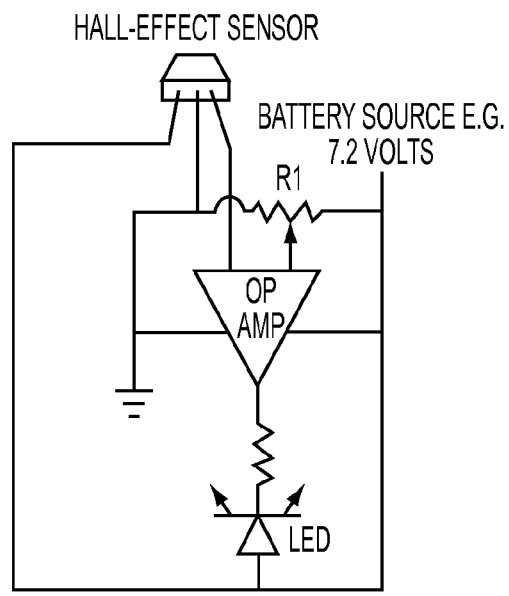
FIG. 9B shows an exemplary circuit comprising a single Flail-effect sensor and an operational amplifier and a light emitting diode indicator for the actuation of the sensor.
Figure 9C:
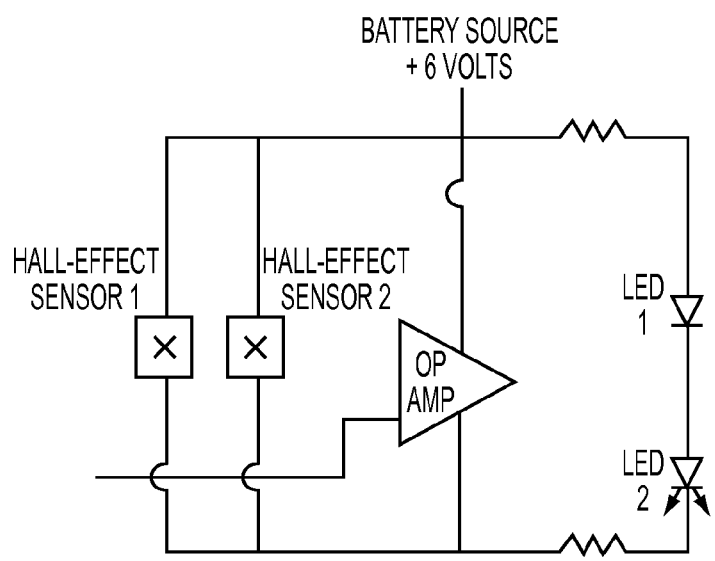
FIG. 9C shows an exemplary circuit of two back-to-back Hall-effect sensors and an operational amplifier and two light emitting diodes to increase sensitivity and range to be N or S polarity independent.
Figure 10:
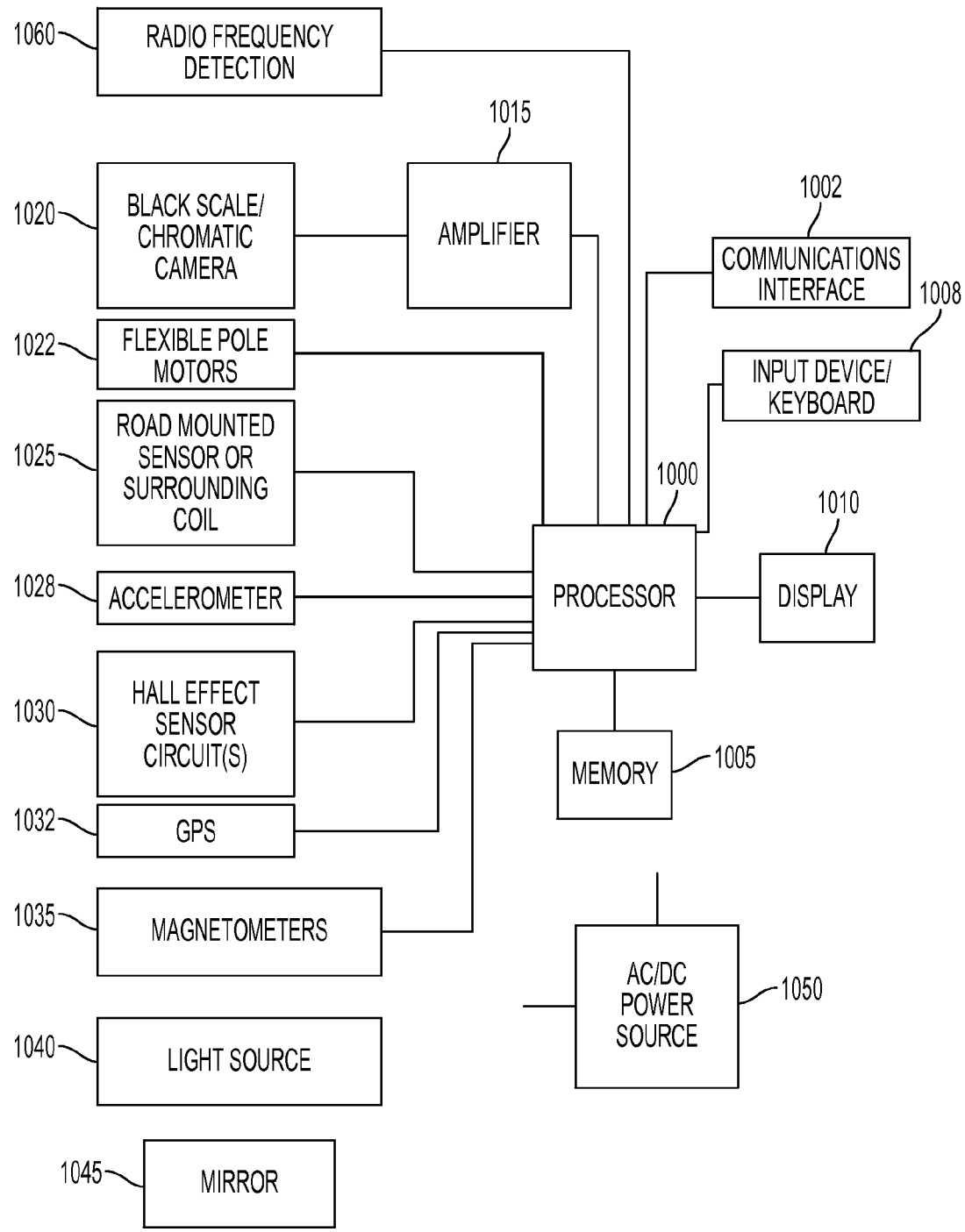
FIG. 10 represents a schematic block diagram of a magnetic field sensor system having a plurality of means for detecting a magnetic field or otherwise detecting an anomaly including but not limited to flexible, hollow pole-mounted or flexible strip mounted sensors, sensor arrays and the like, radio frequency detection for detecting transmissions to/from a sticky device, further including, for example, a black scale or chromatic still or video camera for detecting color distinctions in a typically black vehicle undercarriage that may indicate the presence of a sticky device, a road mounted sensor or surrounding coil similar to that depicted in FIG. 4 plus soft cloth strips for the top and side flexible pole mounted Hall-effect sensors per FIG. 5, magnetometers, a light source, if required, for the camera and the user and a typical mirror per FIG. 1 or 2, a GPS system of the vehicle or a moving sensing system such as a wand; an accelerometer to detect speed; a processor may receive vehicle identity input via an input device and communicate with a remote database or maintain known vehicle magnetic signatures and vehicle images in local memory and processor received data and display an output indicating a possible magnetic field of potential concern on a display responsive to an analysis of all input data about a scanned vehicle automatically.

Referring now to the drawings FIGS. 2A-5 and 10, the details of specific example embodiments are schematically illustrated. All the embodiments of FIGS. 2A through 5 may use one or more of the features shown and described by FIG. 10. For example, a wand or a mirror embodiment may have an RF communications interface and/or an input keyboard. A user could manually enter a VIN number by an input keyboard so that collected data could be matched to a particular year, make, model of vehicle and magnetization signature or camera images retrieved. An RF interface could pick up a Lojack car signal identifying the vehicle. A fob on a key chain must match a Lojack record in a hidden ear Lojack transceiver or the car is considered stolen. An intercepted Lojack communication could be sufficient to uniquely identify a vehicle having a Lojack feature. A car GPS system radio frequency transmission or on-board vehicle telecommunications or radio system may be received by a radio frequency communications interface to uniquely identify a vehicle. An RF communications transceiver of an embodiment could send collected data to a local or remote server and receive back vehicle magnetization signature, car portion images and so on. A vehicle as it uses a smart pass on a highway at a toll booth could be correlated to year, make and model of vehicle for the smart pass for retrieving images and magnetization signature. RF identification is typically used for truckers as they go through weigh stations and border crossings so the RFID could be matched with a particular truck and cargo trailer and so identified. After FIG. 2A through FIG. 5, potential circuits are shown in FIGS. 6-9A, 9B and 9C which may comprise novel arrangements for detecting the presence of a magnetic field of potential concern and displaying an output reflecting same. FIG. 10 provides a schematic block diagram of an embodiment of a magnetic field sensor system combined with other anomaly detection systems which may utilize a plurality of different means taken, for example, from FIGS. 2A-5 and enhanced for detecting a magnetic field of potential concern and discriminating a sensed field from expected magnetic fields by storage and comparison with known magnetic vehicle signatures automatically. These embodiments are not intended to be limiting and may be mixed into various embodiments according to specific applications, for example, at entrances to buildings, border crossings, toll booths and hand-held sensors that may be used by vehicle users. FIGS. 11A, 11B, 11C and 11D show the manufacture of a prototype mirror assembly equipped with three Hall-effect sensors and its demonstrated testing with a simulated sticky device attached by a magnet to a vehicle undercarriage.

Figure 2A:
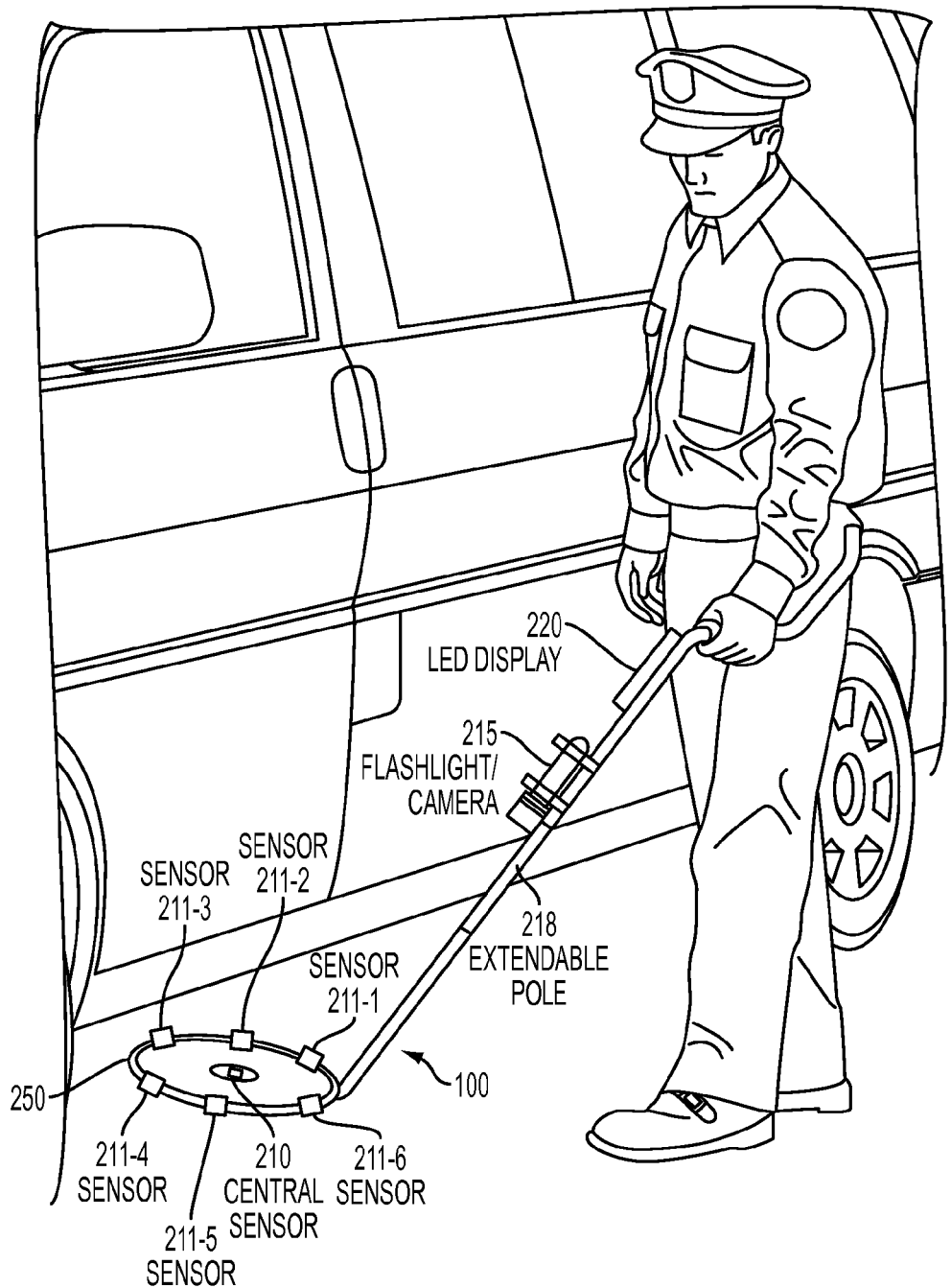
FIG. 2A shows a line drawing similar to that of FIG. 1A to show an extendible pole-mounted mirror that may be retrofitted to incorporate one or more magnet detectors or sensors 210 at its center and perimeter sensors 211 about the perimeter of the mirror (Hall-effect, magnetometer type or hybrid) which may report the presence and location of a magnetic field to a display portion 220 mounted on the pole per FIG. 2B to correspond to the arrangement of the sensors 210, 211 on the mirror.
Figure 2B:
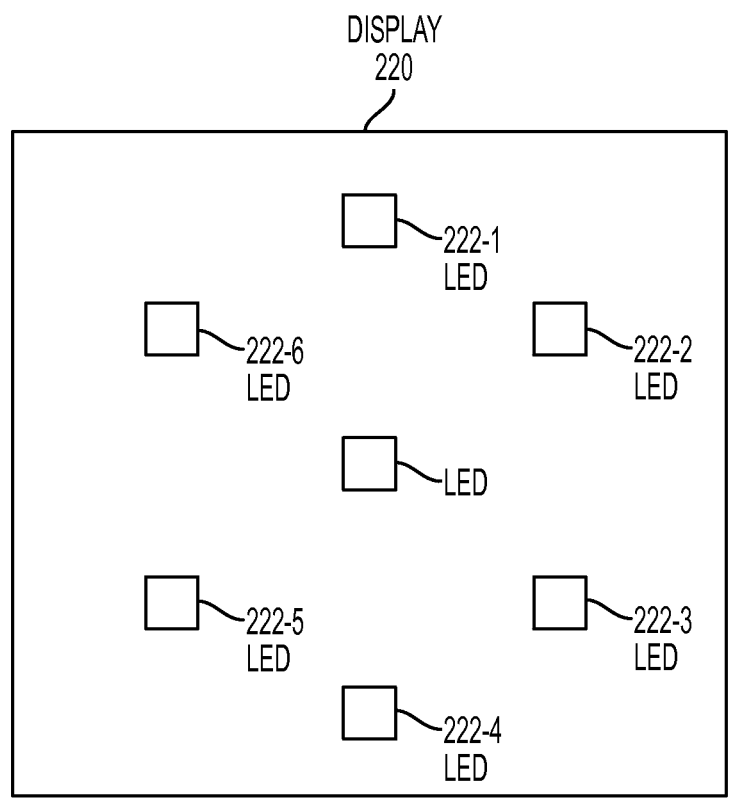
FIG. 2B shows a display of LED's that may correspond to the arrangement at the center and mirror perimeter to show how a real-time display 220 constructed, for example, of light emitting diodes may correspond one to one with the sensors 210, 211 and so display a real-time location of a sensed magnet to a user.

Referring to FIGS. 2A and 2B, there is depicted in FIG. 2A a handheld mirror assembly 100 (for viewing underneath a vehicle) which may comprise an extendible pole 218 known in the art adapted to further comprise a magnetic sensor system and/or a camera system with wheels (not shown). Extendible pole 218 may be manually extendible (for example, telescoping) and hollow for internal electrical wiring from mirror 250 to a power supply and switch near the handle portion. A distal mirror portion 250 may be used for viewing the top of a vehicle with the mirror 250 on the end of the handheld, extendible rod or pole 218, a user using two hands for lifting and turning the assembly by extended pole 218. A Hall-effect sensor circuit or plurality of Hall-effect sensors 210 such as two sensors back to back may be imbedded behind the center of the mirror. In a hybrid embodiment, any sensor 210, 211 may be a magnetometer circuit per FIG. 6 requiring no degaussing when used with a proximately spaced Hall-effect sensor. By "embedded behind" is intended the drilling, for example, of a glass or plastic mirror so that the Hall-effect sensor circuit wiring may pass through the mirror and be channeled through the hollow of the extendible pole 218, for example, to a power on/off switch where a battery power supply may most conveniently located near the handle portion along with a light source and camera requiring power to capture a visual image from the mirror of a vehicle portion. Moreover, it has been experimentally determined that a typical range of operation of a Hall-effect sensor circuit is approximately less than six inches or in the range of over 10 cm so that a typical mirror diameter may be twelve to eighteen inches. To locate a magnetic field, a plurality of Hall-effect sensor circuits 211-1 to 211-6 are shown mounted about the periphery of a mirror, for example, approximately about nine inches apart and from the center of the mirror 250 if the range of a Hall-effect sensor is typically about less than six inches. If greater resolution is desired, additional sensors may be placed to cover practically the entire area of the mirror. Continuing this hypothesis, the diameter of the mirror 250 would be approximately twelve to eighteen inches, and there may be approximately six or seven sensors total, including the center sensor 210. Generally, for vehicle scanning, it is suggested that an appropriate range in mirror diameter be from approximately eight inches to twenty-four inches. With a convex shape, the mirror may cover at least half a vehicle width of an undercarriage. As a Hall-effect sensor range or sensitivity improves, a plurality of sensors mounted about the periphery of the mirror 250 or between the periphery and a circuit at the center of the mirror will permit improved location finding of a smaller valued suspect magnetic field. If larger or flatter mirrors are used, more sensors may be located at an intermediate circular position between the mirror center and the perimeter.

Per FIG. 2A, a typical mirror pole assembly is retrofitted to comprise at least one magnetic field sensor per one of circuits and systems FIGS. 6-10 (i.e. one centrally located sensor or multiple axis or back-to-back dual polarity sensors) which, when actuated, causes a display 220 per FIG. 2B to indicate the presence of a magnetic field, for example, a light emitting diode display and outline its location and shape. Preferably, the one magnetic field sensor is at least a two-axis or three-axis Hall-effect or other sensor with structures at 90° rotation to one another or two Hall-effect sensors mounted back to back on a single die so as to be able to measure any polarity magnetic field to which it becomes proximate at greater range. Embodiments of Hall-effect sensors preferred in any of the depicted embodiments are two-axis or three-axis sensors. Moreover, two Hall-effect sensors may be placed back to back to improve sensitivity and range of field detection regardless of field polarity. During a visual inspection of the undercarriage of the vehicle or other area via light source/chromatic camera 215, a positive reading of the sensor voltage in one or the other or both (or three) axes may indicate the presence of a magnet, prompting a closer examination. Image segmentation analysis may compare a known vehicle portion image with a suspect vehicle portion image to detect an anomaly. The traditional flashlight and mirror with at least a central magnetic sensor may be used in the indicated site of the magnetic field by a user who may be a security officer or a vehicle user. These may be enhanced by a camera for capturing images or by reference to a database of images or magnetic signatures of vehicles by vehicle identity for scanning the vehicle before the vehicle is moved. The mirror may be convex and cause a distorted camera image. Known convex to flat image algorithms may be used to correct a convex image that may cover as large a distance as fifteen feet to a flat image. In accordance with an enhancement, vehicle identity information may be entered by an input device such as a keyboard 1008 (FIG. 10). One or more identified undercarriage vehicle portion images or different vehicle portion images may be obtained remotely and/or stored locally in processor memory 1005 or in memory of a remote server (not shown) reached via communications interface 1002 for the identified vehicle. A chromatic camera 215, 1020 may provide a single or video image of for example, the identified vehicle undercarriage under examination to a central processor 1000 (FIG. 10). Using known image segmentation software, the retrieved vehicle image may be compared with the converted vehicle undercarriage under examination image and an unidentified shape located that is suspect. The operator of the FIG. 2A system may then move the mirror/magnetic sensor into proximity and better examine the suspect shape. As indicated above, a convex parabolic mirror may distort an image and even capture the entirety of an undercarriage and so a planar image restoration algorithm may be used by the central processor 1000 (FIG. 10) so that the image segmentation algorithm may compare camera captured planar undercarriage image to stored planar identified undercarriage image.

According to FIG. 2B, there is shown a display 220 that may comprise a plurality of LED or other known equivalent devices forming a pattern corresponding to the plurality of sensors 210, 211 at the center of and around the periphery of the mirror 250 for viewing the undercarriage, sides, roof, wheel well, engine compartment, interior or cargo area of a vehicle and obtaining an indication of a magnetic field of potential concern at an identified area of concern per the display 220 in combination with the mirror pole assembly of FIG. 2A. While it is believed that magnetic devices may be more commonly affixed to vehicle sides, wheel wells and bottoms of vehicles, location identifying devices may be found adhering to the not typically visible roofs of vehicles, especially, trucks.

Figure 1A:
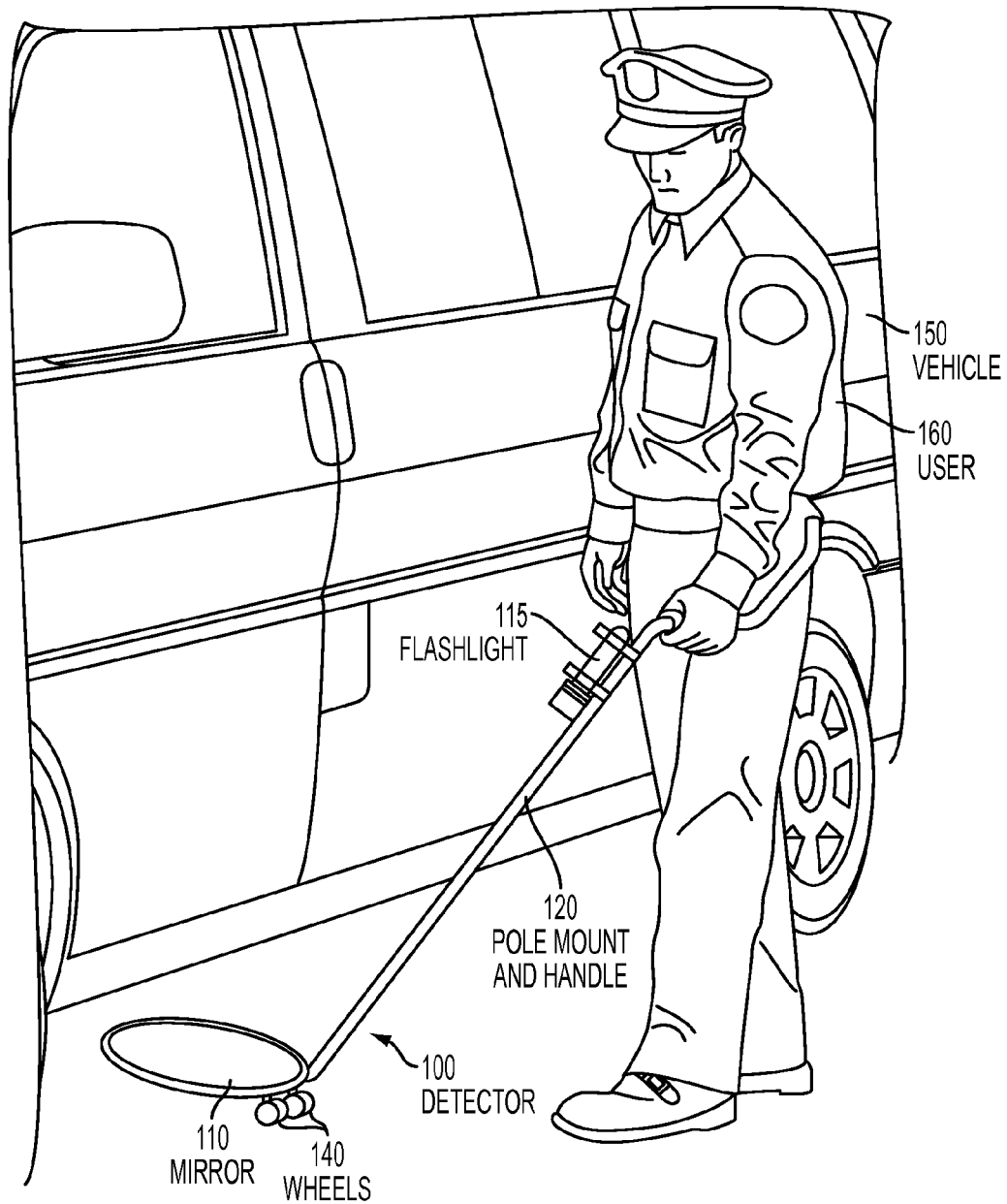
FIG. 1A shows a line drawing of a user of a prior art pole-mounted mirror for manually determining whether the undercarriage of a vehicle 150 exhibits unusual characteristics from a visual observation.

Consequently, FIGS. 2A and 2B depict embodiments of the handheld mirror of FIG. 1A, 1B where an array of Hall-effect sensors are imbedded behind, in or on the surface of the mirror 250 and around its periphery and demonstrate that an embodiment of FIG. 1A, 1B may be retrofitted to incorporate magnetic field sensing using Hall-effect sensor circuits and location of a suspect magnetic field (and, enhanced with a camera system, may detect a suspect shape not normally present on an identified vehicle). Sensor arrays, such as shown in FIG. 2A may illuminate a panel or display 220 consisting of the corresponding light emitting diodes (LEDs) 222 or other visual screen display (FIG. 2B) on which the shape of the magnet may be shown within the array of LED's and thus located when the magnetic device might not otherwise be easily seen). During a visual inspection of the undercarriage of the vehicle or other area, a positive reading of the Hall-effect sensor voltages may indicate the shaped presence of a magnet, prompting a closer examination, deactivation or removal of the device or, at least immediate movement of the vehicle to a safer location for professional removal. Camera enhancement provides improved suspect shape recognition regardless of magnet detection and may be utilized separately from magnet detection to detect suspect shapes via known image segmentation algorithms.

Figure 3A:
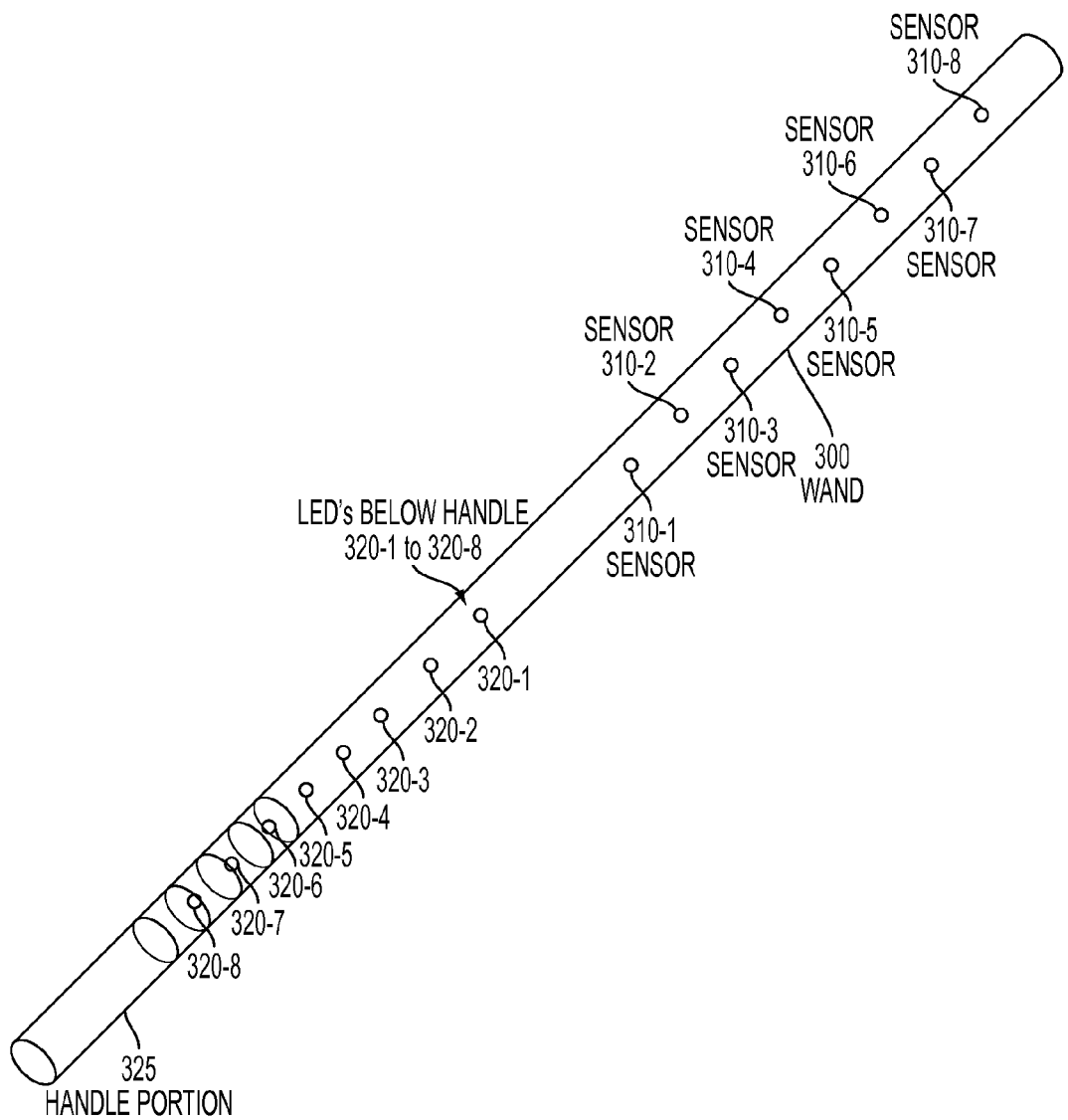
FIG. 3A shows a line drawing of a first, for example, cylindrically shaped wand embodiment 300 of a magnet detector that may be used to pass under, over, around and inside a vehicle to detect magnetic fields.

Referring to FIG. 3A, there is depicted a first wand embodiment of a handheld device consisting of a wand 300 in which a linear array of for example, linearly arranged Hall-effect sensors 310 comprising, for example, a one by six array of back-to-back, multiple axis Hall-effect sensor circuits may be mounted in a line to the wand 300. The wand is preferably light weight, for example, consisting of plastic and be operable using one hand via handle portion 325. In an alternative paddle-like embodiment (FIG. 3B) having a flat surface, for example, three linear rows of six Hall-effect sensors each (preferably at least two or three axis sensors and/or two sensors mounted back to back)) are embedded on a wand surface 310, for example, spaced less than eight inches apart facing the object to be inspected. On the top of the wand, proximate the handle, corresponding LED's 320 or other visual screen displays may directly correspond to the location of the, for example, 3×6 array of Hall-effect sensors 310. The operator of either wand device 300 may move the wand along a surface of a suspect vehicle, interior, exterior, undercarriage or roof (including engine compartment or trunk) where a sticky IED, container or location finder may be affixed to an inside (or outside) surface of the vehicle, may actuate the sensor arrays and vary the intensity and number of the LED's actuated as the sensor becomes closer to the suspect magnetic field, thus showing the outline of a magnet affixed to an explosive device or location finder or container (drugs, key, etc.). In this embodiment, a linear array of, for example, five or six back-to-back, multiple axis Hall-effect sensors 310-1 to 310-8 (eight shown) may be placed at a distal end of the wand (FIG. 3A) while a corresponding LED or other display 320-1 to 320-8 of sensor actuation may be located at a proximal end just below the handle portion 325. This embodiment may be especially suitable for reaching areas of a vehicle such as a wheel well, engine compartment or vehicle interior that a mirror assembly may not reach.

Figure 3B:
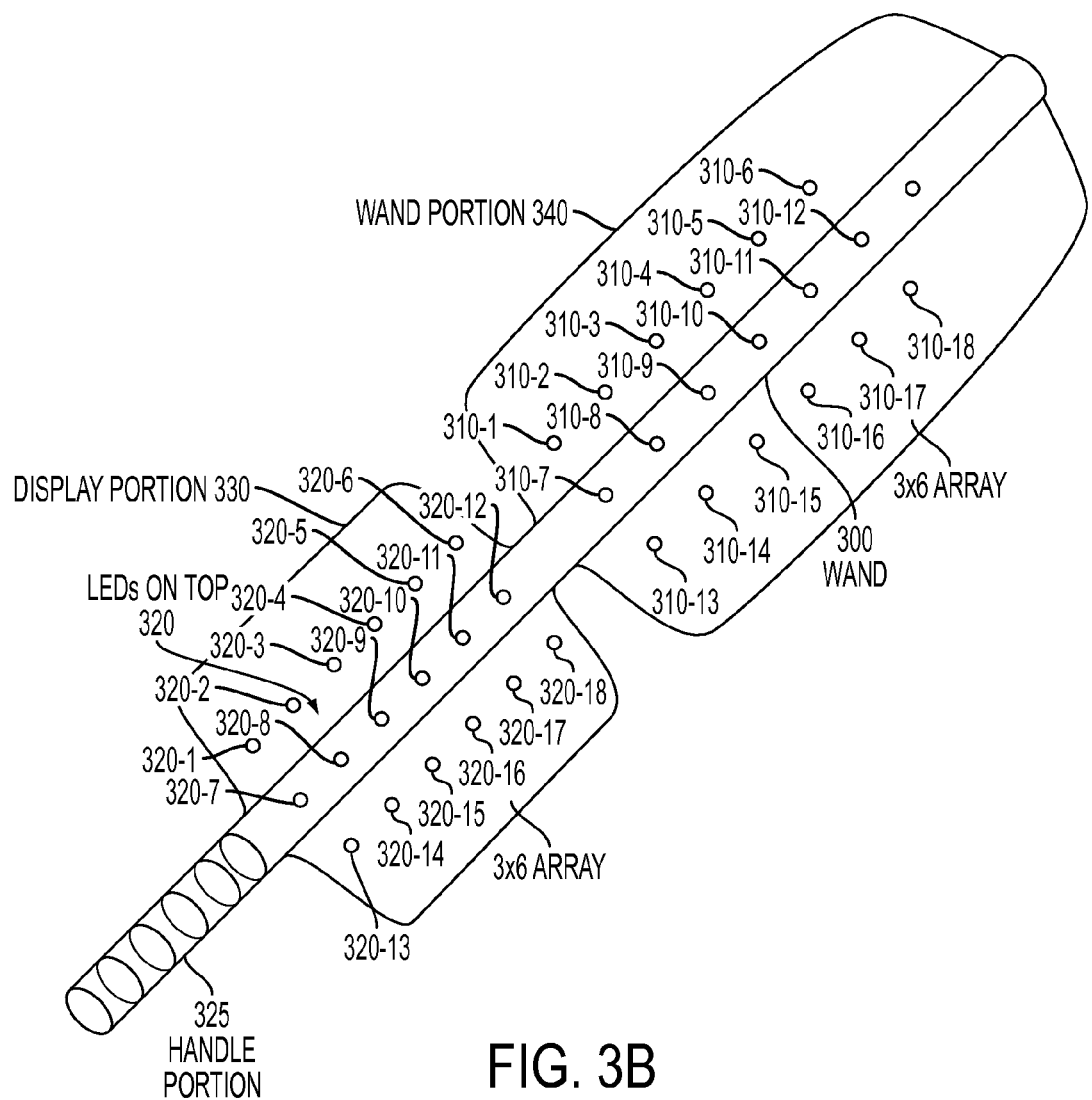
FIG. 3B shows a line drawing of a second wand embodiment more shaped like a paddle. A plurality of, for example, an array of 3×6 Hall-effect sensor magnetic field detector circuits are mounted on one side of the bottom paddle portion of wand 300, for example, back-to-back, multiple axis or single Hall-effect sensor circuits or other circuits as will be discussed further herein, and associated and corresponding light emitting diodes, also, for example, in a corresponding 3×6 array, are shown proximate to a handle portion actuated whenever a corresponding magnetic field sensor is activated (individually in LED groups of two or three or four) so that the user may visibly see an outline of a detected magnetic field via the actuated light emitting diodes mounted proximate a user handle portion as a display portion. Preferably, Hall-effect transducers having a two or more axis sensing feature and mounted back-to-back to actuate regardless of field polarity are used in the magnetic field sensors.

FIG. 3B shows a line drawing of a second wand embodiment more shaped like a paddle. In a prototype embodiment, the paddle wand has been used to selectively measure a magnet (which may be attached to a sticky device) having a field of strength 3000 Gauss at six inches. With all embodiments described herein, a selectable range of field strength may be incorporated into the various embodiments by for example, using more sensitive Hall-effect sensors, the coarse/fine tuning circuit of FIG. 7 and/or selectively actuating the more sensitive versus less sensitive sensors with a selectable switch or, in an alternative embodiment, using a potentiometer to vary the range of voltage applied to a Hall-effect sensor circuit to decrease or increase sensitivity by changing an applied DC voltage level.

The handheld wand 300 of FIG. 3A or 3B may also be used to assess the presence of magnetic materials in post-blast detonation of IED's to determine if the debris in a field area contains remnant portions of a magnet from a sticky IED. This material could be more easily collected without contamination once located. Furthermore, once recovered, the piece of magnet may be forensically analyzed for its original composition, for example, AlNiCo or ceramic, its original size, its original properties and potentially its original source or manufacturer may be identified. In either embodiment, a GPS sensor and an accelerometer may be mounted, for example, toward the distal end (not shown) to capture the first and second wand embodiments in three dimensional space at a particular location and having a particular speed determined by the operator. The location and speed may be communicated by an RF communications circuit (not shown) for communication to a remote server by a communications interface 1002 per FIG. 10. The GPS unit may track the location of detected magnetic fragments of an IED after a bomb explosion. While typically intended to be portable and carried by the handle portion, the wand or linear array embodiments may be also formed as a part of a structure such as the frame structure 525 (FIG. 5) to be discussed further herein for scanning the sides, top and bottom of a vehicle.

Figure 4:
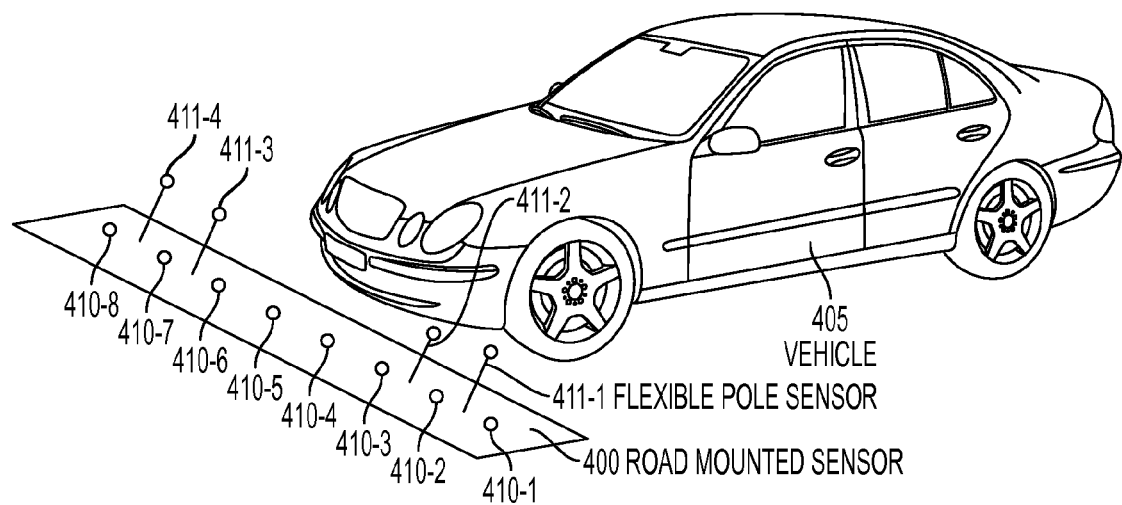
FIG. 4 represents a line drawing of a vehicle passing over a road mounted band sensor, the sensor system comprising a plurality of sensors mounted on the band and also comprising flexible, hollow pole mounted sensors for reaching into vehicle wheel wells for passively detecting the presence of a magnetic field and operating a corresponding, for example, light emitting diode display, not shown, at a proximate or remote user station for signaling the presence of a magnetic field, for example, of a sticky device located in a wheel well, different vehicles having different magnetic field signatures. A stored magnetic field signature may be subtracted from a sensed signature and the display show a magnetic field of potential concern. Per FIG. 10, also, a camera system 1020 may be used to capture images of an undercarriage of the passing vehicle, and image segmentation analysis may be used to distinguish a visible anomaly automatically. When a convex mirror system is used a known convex to flat image conversion algorithm may be used to convert a convex mirror image to a flat image.

Referring to FIG. 4, depicted is an embodiment of a road mounted magnetic field sensor device 400 consisting of a linear array of Hall-effect sensors or other magnetic field sensor 410 such as a soft iron core and associated coil. As discussed above, preferably two-axis or three-axis and/or back-to-back Hall-effect sensors are used to form the linear array to increase range and sensitivity. In addition, in order to reach under wheel wells and into engine compartments, a plurality of linear motor driven, vertical, flexible, hollow pole-mounted Hall-effect sensors 411 may be provide, for example, in the vicinity of a wheel well, engine compartment or other recessed location of a vehicle. The flexible, hollow pole-mounted Hall-effect sensors comprise an extendible, hollow pole which may be strong but hollow to permit electrical connection to a processor 1000 per FIG. 10 along with the road-mounted sensors 410. These parallel inputs may be connected and uniquely identified to the processor in a conventional, known manner. Motors for vertically moving the pole mounted sensors 411 are not shown but the poles may be moved to an appropriate vertical height according to a vehicle identity input per keyboard/input device 1008 (FIG. 10). The linear sensor array 410 and vertical pole mounted sensors 411 may be embedded on the road surface and the poles facing and facing upwards and being bendable under the object or vehicle 405 to be inspected, for example, at a border crossing or building entrance. The array 410, 411 can be permanently affixed to the pavement and comprise a "bump" or mounted on a flexible and durable strip that can be temporarily affixed to the pavement. As will be further described herein, known vehicles as they cross a magnetic field sensor may exhibit known or expected magnetic field signatures as the vehicle crosses the sensor 400. In one embodiment, per FIG. 10, a user enters the make, model and year of the vehicle via input device 1008 in order to obtain a known or expected magnetic field signature (as well as an undercarriage camera image for image segmentation analysis for anomalies). Such a magnetic, signature may be subtracted from the results obtained from road mounted sensor 400 and provide a display and location of a suspected magnetic field. Also, a road mounted sensor 400 may be enhanced by one or more light sources and cameras (not shown) for imaging an undercarriage and exposed area such as an engine compartment and comparison to known images retrieved from an image database via image segmentation.

Figure 5:
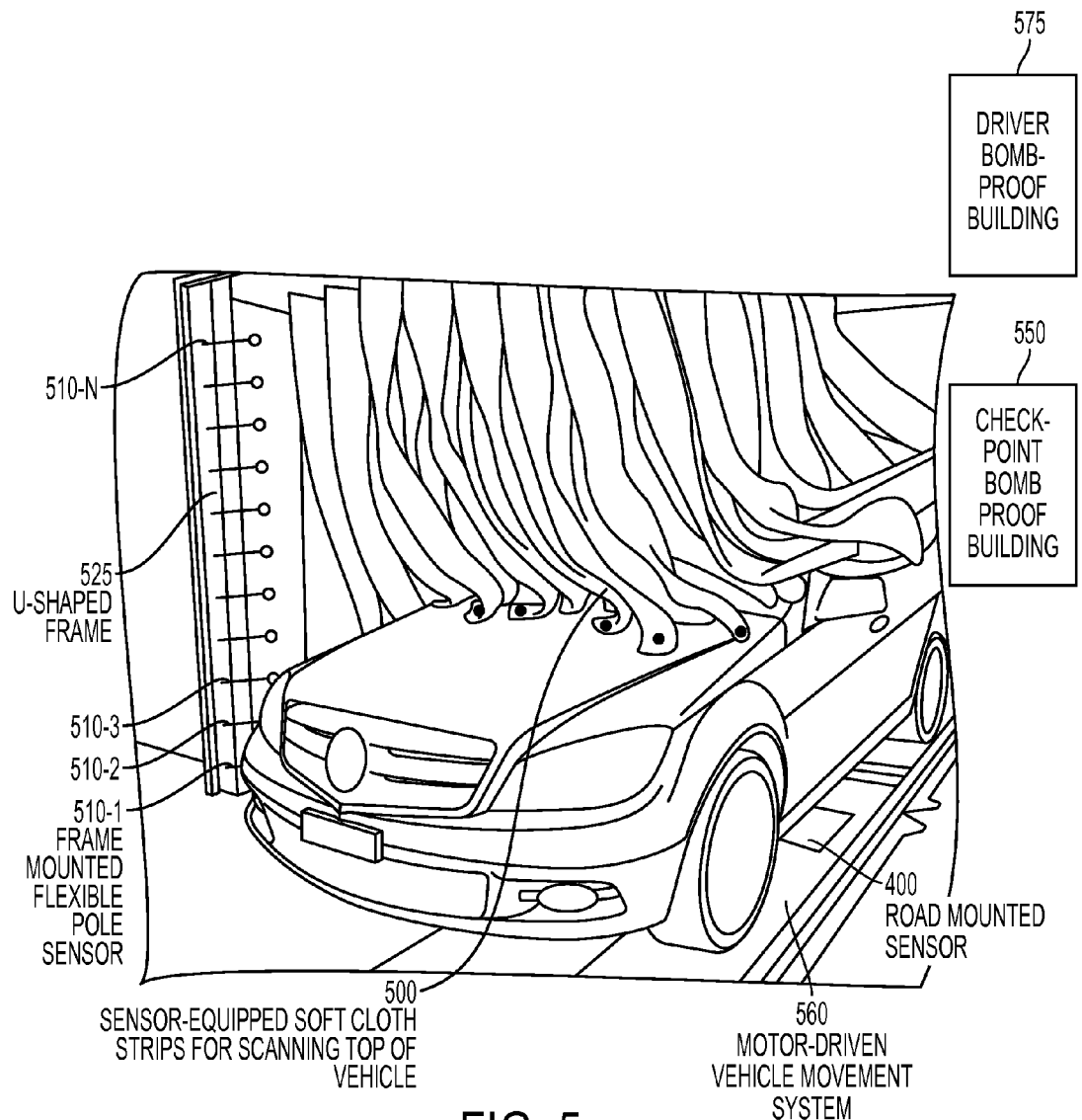
FIG. 5 represents a line drawing of a vehicle passing through a plurality of magnetic field sensor-equipped soft cloth strips of a U-shaped frame 525 also having horizontal and vertical, vehicle side and bottom, hollow, flexible pole-mounted sensors. These and a road mounted sensor 400 of FIG. 4 wipe over the sides, bottom and top of a vehicle and, in a similar manner to that of the embodiment of FIG. 4, known magnetic field signatures may be subtracted from sensed signatures at predetermined locations and a display shows a magnetic field of potential concern and/or cameras are used to detect visible anomalies automatically.

Referring to FIG. 5, there is depicted an embodiment of a vehicle roof inspection sensor system comprising a linear plurality of flexible strips, not unlike that found in a car wash, mounted to a reverse U-shaped frame 525. The flexible strips 500 contain sensors at the ends such as Hall-effect sensors for scanning a vehicle from a frame, doorway, or interior space. Again, preferably two-axis or three-axis and/or back to back Hall-effect sensor circuits are used at the vehicle roof end of each flexible strip. Electrical wiring may be flexible and run from the sensors up the flexible strip, through the frame 525 to the processor 1000 of FIG. 10. Moreover, frame-mounted, horizontal, flexible pole mounted sensors 510-1 to 510-N may sweep the sides of a vehicle as it is pulled by a motor-driven vehicle movement system 560 (optional) such as one used at a car wash. The sensors may be uniquely identified and their output data may be multiplexed and sent as a serial input to the processor by a multiplexer not shown or sent in parallel by wire or secure radio frequency transmission (not shown).

Also optional, the vehicle driver may be invited to await inspection in their own driver bomb-proof building 575. (It is conceivable that the vehicle driver may be wearing a bomb and the building 575 be not only bomb proof but contain bomb detection equipment). The vehicle inspector may be located along with the processor 1000, keyboard 1008, display 1010, communications interface 1002 to a remote server and image or magnetic signature database and other items depicted in FIG. 10 in check-point bomb proof building 550. In this embodiment, the vehicle may be pulled through the frame 525 by a chain drag system and confining lengthwise track 560 (similar to those used in a car wash) under control of the system operator. In an alternative embodiment, the depicted vehicle may be driven by its operator through this frame 525 containing the flexible cloth strips, horizontal sensors 510 and underground sensor and vertical poles system 400. The road-mounted sensor system 400 may be used to swipe and scan the undercarriage as the vehicle moves through frame 525. Embedded on the ends of the flexible strips 500 are, for example, two axis or three axis Hall-effect magnetic field sensors or back-to-back Hall-effect sensor pairs that can detect the presence of a magnetically affixed explosive, location finder or container device as the vehicle passes through the frame 525, thus allowing the sensors to come into contact as the vehicle brushes through these flexible strips and horizontal detectors 510 and road-mounted sensor system 400. As with the embodiment of FIG. 4, a known vehicle signature or image can be retrieved from memory for comparison with a sensed magnetic field signature or images and suspected areas of the vehicle may be identified by means of a camera and light source for the top, sides and undercarriage (not shown).

An important factor in using hidden detectors for detection of magnetically affixed devices is secrecy of the security inspections (for example, per FIGS. 4 and 5 or a combination thereof). For example, the underground system 400 may be practically invisible in a road surface and the frame 525 may be built into a fortified building entrance or portico area (not shown). Hidden surveillance increases the chance of detecting these explosive and tracking devices. By not making the surveillance methods obvious, the detection of careless or sloppy affixed devices by potential terrorists may have a higher probability of success. Complete screening may be done on large numbers of vehicles passing through public and private areas, over border crossings, toll booths on interstate highways or at building entrances.

It is contemplated and within the scope of this disclosure that data from the detectors, location (UPS 1032), time of day, and/or video images of vehicles being inspected may be gathered, transmitted and stored for future reference by police authorities, the military, and/or government anti-terrorist agents via any of the embodiments of FIG. 2A to FIG. 5. Real time correlation of sensor data location, time, and/or video images may also be useful for tracking specific incidents, crisis situations and identification of security threats. The sensor information may be sorted into bundles of data, types of data, attributes of data, etc. along with the location and identity of the sensor system, for example, per FIG. 4 or FIG. 5 from which data is collected for an identified vehicle and transmitted via a communications interface 1002 (FIG. 10) for remote analysis at a remote location or cloud server.

Any of the aforementioned detection devices may be located at, by way of example, and not intending to be limiting: loading docks, ferry boat docks and ramps, bus terminals, air ventilation ducts, building entrances, parking garage access gates, mechanical access tunnel entrances, moving sidewalks, elevators, escalators; ingress and egress points of buildings, trains, subways, airports, buses and bus stations, etc.

Figure 6:
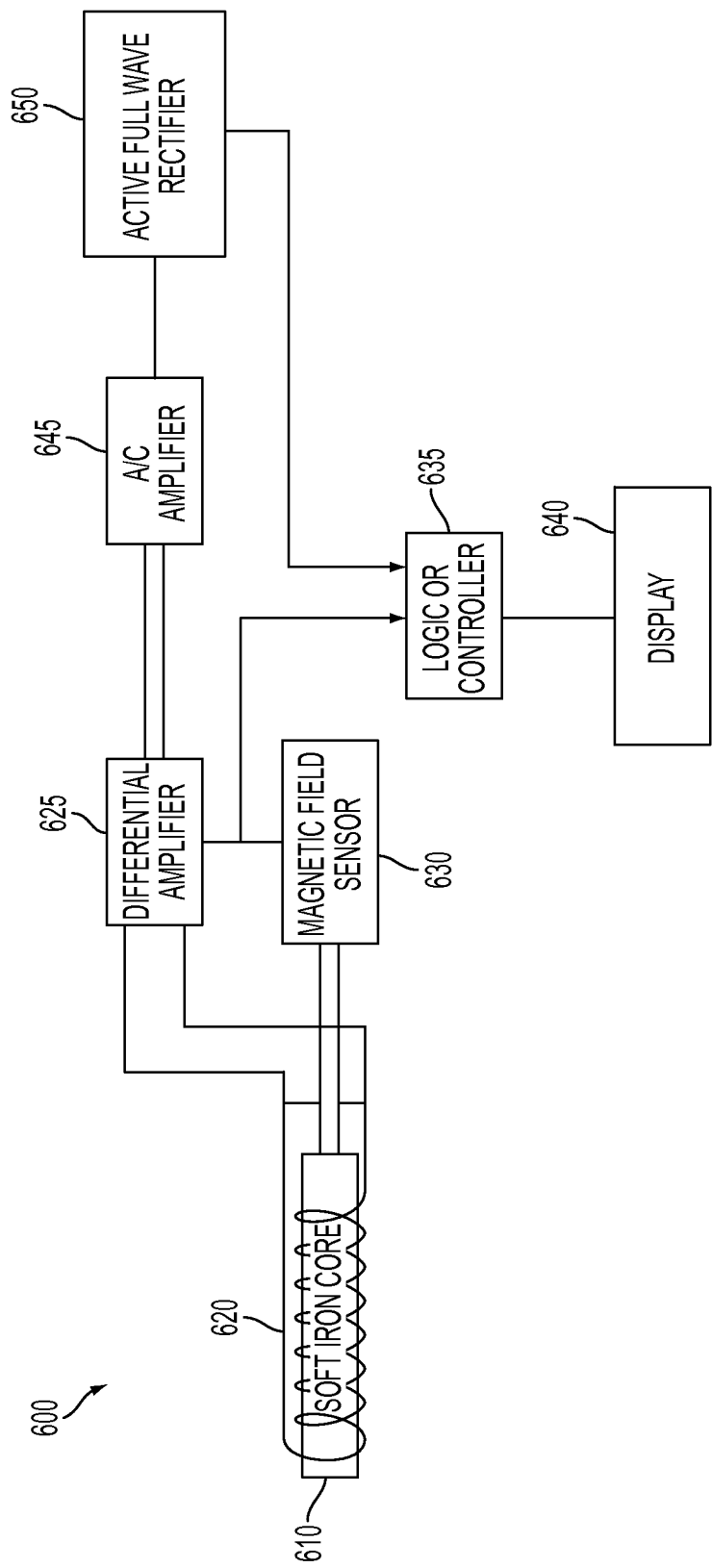
FIG. 6 represents a soft iron core magnetic field sensor which may become magnetized in the presence of a magnetic field and detected via the a winding at magnetic field sensor 630; a display or LED's may be lit to show the detected magnetic field.

FIGS. 6-9C show a plurality of sensor circuits for suspect magnetic field sensing. Referring to FIG. 6, there is shown a block schematic diagram of a soft iron core magnetic field sensor for use in detecting magnetic fields produced by, for example, sticky IED's, containers and location finders. Sensor circuit 600 represents a soft iron core magnetic field sensor 620 which does not require degaussing if it is used in combination with a Hall-effect sensor circuit at a predetermined distance such that the iron core 610 may falsely trigger an adjacent Hall-effect sensor per, for example, one of FIG. 9B or 9C. On the other hand, if the Hall-effect sensor and the magnetometer of FIG. 6 are used side-by-side, the soft iron core may be initially or periodically degaussed via a short duration A/C voltage produced via an A/C voltage generator. The circuit of FIG. 6 is intended to serve as a circuit for use in a hybrid device with Hall-effect sensors spaced, for example, six inches away from the soft iron core 610. Coil 620 may detect a magnetic field of suspect origin. In other words, the closer soft iron core 610 may come in proximity to a magnetic field by the square of the distance, core 610 may become magnetized in the presence of the magnetic field. The magnetic field may be detected via the winding 620 at magnetic field sensor 630. Differential amplifier output 625 receiving input from core 610 wrapped by coil 620 is output to A. C. amplifier 645 whose output is rectified at active full wave rectifier 650 and is one output, along with the shared output of differential amplifier 625 and sensor 630 as an input to logic/controller 625 for lighting display 640. Magnetic field sensor 630 as well as rectifier 650 reports to logic circuitry or controller 635 which, in Mm may actuate a display 640 or LED's lit to show the presence of the detected magnetic field.

An alternative embodiment may comprise a square or other shaped core 610 that may be configured to receive a first winding 620 as shown so that the polar positions of the magnet are left and right, north and south. A second winding may be wound over or through the first winding 610 so as to be wound at 90 degrees or orthogonal to the first winding 610. Core 610 may be magnetized to have magnetic poles facing up and down. If the core 610 is magnetized up and down and winding 620 is used to detect the magnetic field, it may fail to detect the orthogonal magnetic field, but the second winding will detect it. The first and second windings then will detect either polarized orthogonal magnetic field caused in core 610 by approaching, for example, a permanent magnet of a sticky device.

A hybrid embodiment is also possible. In such an embodiment, one or more iron core magnetic sensors (FIG. 6) may be used, for example, on a mirror or in a wand embodiment or other embodiment where the iron core magnetic field sensor may detect a magnetic field that a Hall-effect sensor does not. In such an embodiment, the Hall-effect sensor (for example, FIG. 9B or 9C) will not falsely trigger when the iron core magnetic sensor becomes magnetized by the magnetic field it is detecting. Using such a circuit as the circuit of FIG. 6 with a Hall-effect sensor circuit spaced from it as, for example, per FIG. 9B or 9B, it may not be necessary to sequentially operate the Hall-effect sensors and the spaced iron core magnetic field sensor. Degaussing the iron core magnetic field sensor iron core may not be required unless the Hall-effect sensor is extremely sensitive. If degaussing is required, as is known in the art with an alternating current pulse, a length of time may be required to degauss the iron core magnetic field sensors so a magnetized iron core does not falsely trigger a nearby or highly sensitive Hall-effect sensor.

Figure 7:
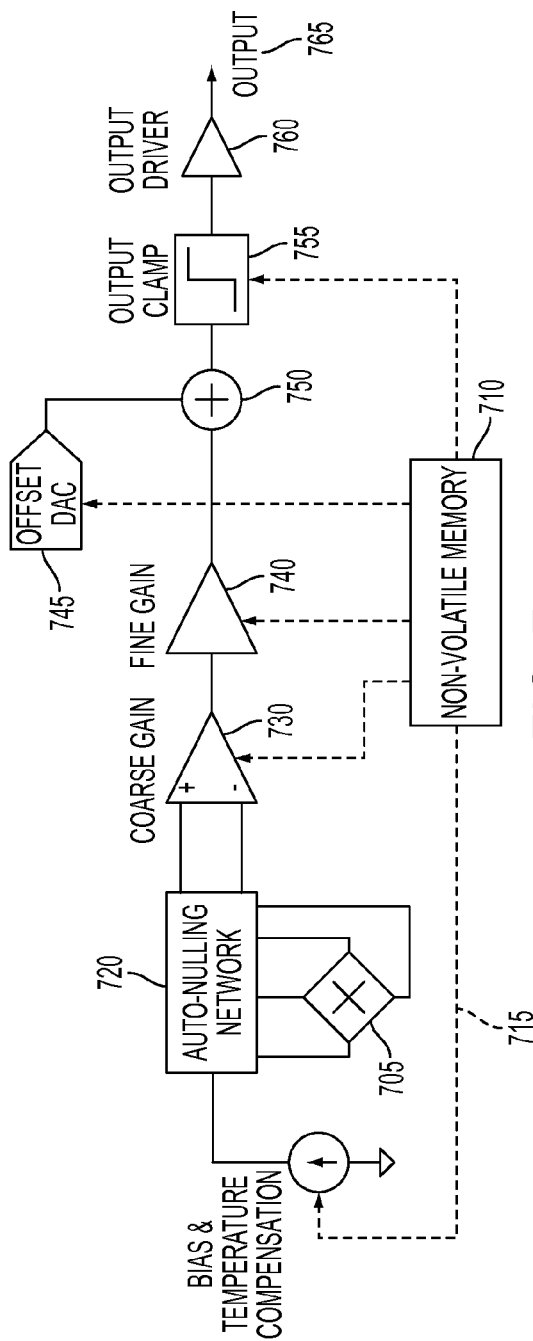
FIG. 7 represents an electrical circuit block diagram of a linear Hall-effect sensor 705 with coarse and fine grain tuning for detecting different Gaussian levels as well as bias and temperature compensation for detecting a magnetic field.

FIG. 7 represents an electrical circuit block diagram of a linear Hall-effect sensor 705 with coarse and fine grain tuning as well as bias and temperature compensation for detecting a magnetic field. Hall-effect sensor 705 connected to auto-nulling network 720 may be linear or non-linear in nature but operates at a predetermined level of field strength measured in gauss and preferably comprises a two axis, three axis sensor and/or back-to-back sensors. The output of sensor 705 may be provided to anti-nulling network 720 to compensate for selectable field sensitivity and detection ranges in actuation of switch 705. For example, coarse grain amplifier 730 may provide a coarse grain setting for switch 705 actuation and fine grain amplifier 730 may provide a finer grain setting for actuating switch 705 in the presence of a magnetic field. An offset digital to analog converter may provide a constant offset depending on, for example, known characteristics of a vehicle to be measured that may be offset from detected readings at adder 750. The output of adder 750 may be clamped at clamper 755 and the output driver 760 produce an analog output for processing as will be described in conjunction with FIG. 10. A non-volatile memory may be loaded with predetermined bias levels and temperature characteristics of magnets to be detected and characteristics of the particular sensor 705 used. In this manner, non-volatile memory 710 may provide a clamping output to clamp 755, an offset to offset DAC 745 and a bias and temperature compensation value to sensor 705.

Figure 8:
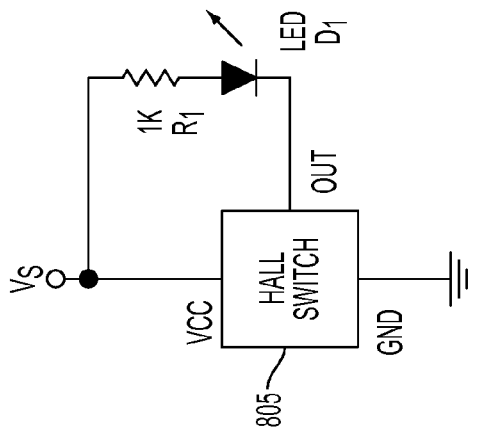

FIG. 8 represents a simple diode circuit for use with the circuit of FIG. 7 whereby the Hall-effect sensor 705 is now represented as Hall switch 805 for operating, for example, a light emitting diode D to signal the presence of a magnetic field when the switch 805 is switched on. A 1 k ohm resistor $R_1$ is shown by way of example only and is not intended to be limiting. The resistance value, if any, is determined by the current needed to light diode $D_1$ and the characteristic output of switch 805.

FIG. 9A represents a plurality of Hall-effect sensors per FIG. 7 which may be used with the LED displays of FIG. 8. The sensor circuit is connected by a bus to bus master 910. Each Hall sensor circuit 900-1 to 900-N may comprise a sensor 905 and associated microcontroller 910. The sensors 905 may trigger at different values of magnetic field strength in gauss in order to detect a range of different magnetic fields and magnets, for example, ceramic and AINiCo magnets among others. They may trigger in a line or as an array per any of FIG. 2A, 2B, 3, 4 or 5. For example, a typical remnant induction or flux density B present in a closed ring in a saturated state for a typical ceramic magnetic may be 3850 Gauss. For an AINiCo magnet, a range in B may be from 8,200 to 12,800 Gauss and for NdFeB up to 13,500 Gauss. Hall-effect sensors are on/off binary devices operative at a relatively high sensor on point and to turn off at a relatively low level of gauss. Magnetic field strength diminishes with the square of the distance. So the closer any magnetic field detector is to a magnet, the more likely the detector will turn on. Temperature also impacts both the residual level of gauss in a permanent magnet and also impacts the characteristics of the field detector. Consequently, the circuit of FIG. 7 advantageously compensates for temperature and, when formed into an array of different sensors of varying sensitivity, the circuit of FIG. 9A, 9B or 9C when utilized with the circuits of FIGS. 6, 7 and 8 (to display an output) may provide identification of magnetic field strength, magnet type and size. Forensically, it may be possible to reconstruct a magnet from a discovered fragment and even, in combination with data of its alloy mixture, determine the source of its manufacture of the magnet.

FIG. 9B shows an exemplary circuit comprising a single Hall-effect sensor and an operational amplifier and a light emitting diode indicator for the actuation of the sensor. This circuit is exemplary only as many different operational amplifiers. Hall-effect sensors or light emitting diodes may be utilized to replace those shown. One input of a Hall-effect sensor is, for example, an optimal 7.2 volts for maximum range. Changing the input voltage is one way to change the range or sensitivity. A first output to an operational amplifier is provided directly to an operational amplifier and the other output is provided to variable potentiometer R1 and then to the operational amplifier. The resistor R1 (which may be a potentiometer) cuts the supplied power to a level for maximizing sensitivity and/or providing a selectable range of the Hall-effect sensor. FIG. 9C shows an exemplary circuit of two Hall-effect sensors arranged back to back and connected in parallel with one another and providing inputs to an operational amplifier and two light emitting diodes to increase sensitivity and range, and which will light notwithstanding the polarity of the suspect magnetic field or direction. One of the Hall-effect sensors will detect the field if the other does not. In a test of such a circuit, a back-to-back Hall-effect circuit may comprise back-to-back A1301 Hall-effect sensor integrated circuits formed as a 3-pin SOT23W for surface mount circuit. These have a sensitivity of 2.5 mV/G. With such a circuit, a range of approximately six to seven inches for detection of a typical magnet was achieved. An A1302 circuit has an improved sensitivity of 1.3 mV/G and may, if tested back-to-back, achieve a much larger, perhaps double range of detection of twelve inches. So selectable ranges are possible by using A1301's and A1302's in selectable arrangements. These circuits are available from Allegro MicroSystems LLC of Worcester, Mass.

FIG. 10 represents a schematic block diagram of an enhanced magnetic field sensor system having a plurality of means for detecting a magnetic field or locating a suspect shape by known image segmentation algorithms. These magnetic field sensors may include but are not limited to radio frequency (RF) detection 1060 for detecting transmissions to/from a sticky device or suspect shape. It is known that radio frequencies such as a cell phone signal may be utilized to detonate an IED. Moreover, periodic RF signals from the IED may indicate to a controller that the device is alive and functioning. Thus, RF detection 1060 may be a very useful adjunct to magnetic field detection. Further, for example, a black scale or other chromatic camera 1020 may detect and amplify via amplifier 1015 color distinctions in a typically black vehicle undercarriage or other vehicle anomaly. These color distinctions may indicate the presence of a sticky device or suspect shape, not normally present for an identified vehicle for further investigation. Also, as suggested above, planar image translation may be performed if for example, an image is captured by a parabolic mirror. Image segmentation algorithms known in the art may be utilized to segregate a suspect portion of an image from a known image of an identified vehicle. The input from the camera is fed to processor 1000 which receives magnetic signal indications electrically in series as a single multiplexed transmission or in parallel, radio frequency and video inputs from, for example, a road mounted sensor or surrounding coil 1025 similar to that depicted in FIG. 4, the camera 1020, RF detector 1060, the soft cloth strips for the top per FIG. 5, the flexible pole mounted sensors of FIG. 4 or FIG. 5, the Hall-effect sensors 1030 per FIGS. 7-9, soft iron core sensors per FIG. 6, known magnetometers, a light source, if required, for the camera 1020 and a typical mirror per FIG. 1 or 2. The camera output may be amplified, if necessary, by amplifier 1015 toward processor 1000. Flexible, hollow, for example, telescoping poles and motors 1022 (horizontal or vertically rising) may be driven to extend or retract pole sensors once vehicle identification is input to processor 1000 by input device 1008 to place vertical pole sensors of system 400 or horizontal pole sensors 510 proximate the vehicle under examination. Hall-effect sensors 1030 or magnetometer-type circuits 1035 may be used individually or as pluralities in lines or arrays or in a hybrid embodiment comprising both types of field sensors. Further inputs to processor system 1000 may comprise GPS input 1032 and accelerometer input 1028. A GPS input may be provided from a vehicle under inspection, from a location of a sensor system in connection with vehicle location GPS data received via RF detection 1060 to determine specific sensor location and comparison to specific vehicle location data. An accelerometer 1028 may provide an input as to sensor velocity or, via an RF detector 1060, vehicle speed in relation to sensor system location. For example, the velocity and location of a wand 300 embodiment may be determined in relation to the velocity and location of a vehicle. Processor 1000 may maintain known vehicle magnetic signatures and vehicle images in memory 1005. Processor 1000 may receive or transmit vehicle data or retrieve or transmit image or magnetic field data via communications interface 1002, process the data via non-volatile memory signatures and image inputs for make, model and year of vehicle entered via input device or keyboard 1008 or determined by signature and display an output indicating a possible magnetic field of potential concern on a display 1010. An AC/DC power source 1050 provides power to any device requiring power, for example, AC degaussing power for degaussing a soft iron core sensor per FIG. 6 or DC power for Hall-effect sensor circuits and diodes and the like. Also shown are a conventional mirror 1045 and light source 1040 for visual or camera 1020 inspection.

In a further enhanced embodiment according to FIG. 10, the accelerometer 1028 and a GPS system 1032 may be used on the vehicle or on the scanning embodiment such as a wand or mirror assembly in order to compare three-dimensional space location of such a scanning assembly in relation to a three dimensional image of an identified vehicle. Use of vehicle location GPS and accelerometer data and scanner data may likewise be useful in the embodiment of FIG. 5 for locating a suspect magnetic device or suspect shape in combination with device mounted GPS and accelerometer data as the vehicle passes through the frame.

Prototype Mirror Assembly Using Hall-Effect Sensor Circuits

Referring now to FIGS. 11A-11D, a prototype Hall-effect sensor mirror assembly has been constructed from an off-the shelf mirror assembly on wheels per FIG. 1A by retrofitting the assembly with three Hall-effect sensor circuits mounted at the center and to each side of the center at the periphery of the mirror which measured eighteen inches in diameter. The inventors first experimented with voltage level in order to optimize the range of magnet detection of a KEYES KY-024 Hall-effect sensor circuit, commercially available from electronic supply outlets and manufactured in Guandong, China. This circuit includes a commercially available 49E Hall-effect sensor and a LM398 operational amplifier and a diodes circuit that is very inexpensive. The result of testing suggests that for a voltage of 7.2 volts DC, the range of the magnetic field detection of the provided Hall-effect magnetic field sensor was on the order of 10 cm's. It is proposed that with a 9 volt battery that a commercially available voltage regulator or potentiometer may be used to drop the nine volts to the approximately 7.2 volts for maximum range or used to vary the sensitivity of field detection.

Figure 11A:
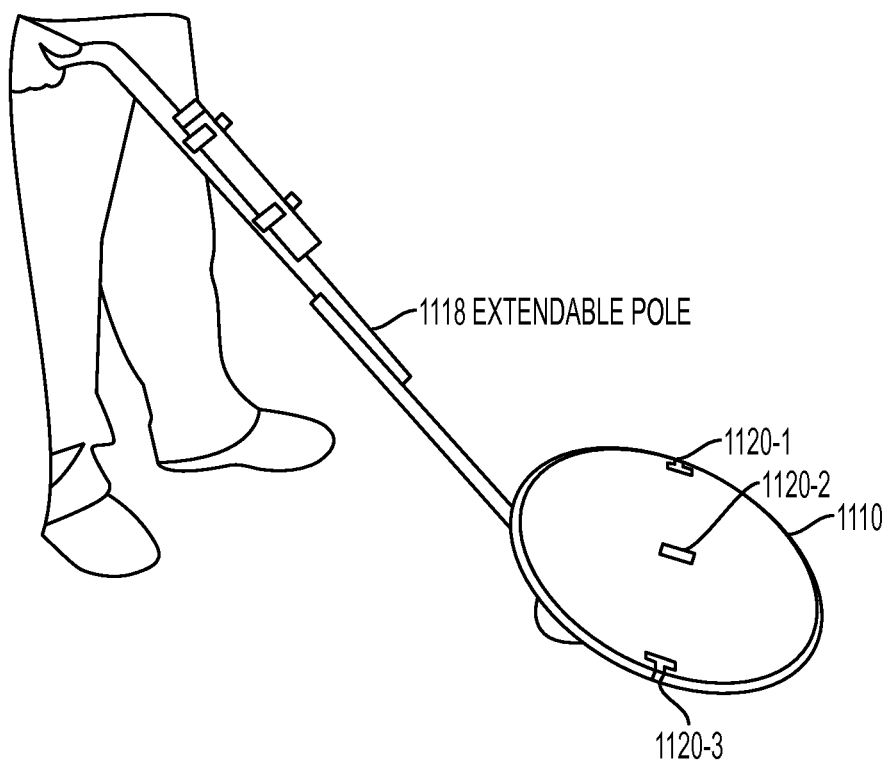
FIG. 11A shows an experimental prototype pole-mounted mirror on wheels with a handle and with three Hall-effect sensor circuits mounted on the mirror, each having their own power indicating LED and sensing LED indicators of a magnetic field, the center of the mirror having been drilled for passing wires and having a hollow extendible pole.

FIG. 11A shows the retrofitted mirror assembly on wheels with a mirror 1110 on which are mounted three Hall-effect sensors circuits in a line. The center of the mirror 1110 was drilled using a 3/16 inch diamond drill bit using a Bridgeport Milling machine including a Sinpo XYZ Digital Read-Out system. The resultant aperture was sufficiently large to permit power wiring to pass to a KEYES KY-024 Hall-effect sensor/diode circuit available on e-bay and a number of circuit suppliers on the web and manufactured in Guandong, China. There are two LED's provided, one which activates when power is provided to the circuit and the other LED is actuated according to the received signal strength determined by the operational amplifier output from the Hall-effect sensor. This LED lights dimly when a weak field strength signal is sensed and brightly when a strong field strength signal is sensed by the Hall-effect sensor.

Pole 1118 may be hollow and extendible (for example, telescoping), but, in the prototype comprised two pieces to extend to maximum length. The mirror assembly was equipped with wheels but was sufficiently light so as to be liftable using two hands above a vehicle roof. The lower piece was hollow and allowed power signal wiring to pass from the bottom of the mirror half-way up the pole. A flashlight or camera or both holder is shown provided at a handle end. A battery power supply and a power on/off switch may be installed into the prototype at the handle end.

Figure 11B:
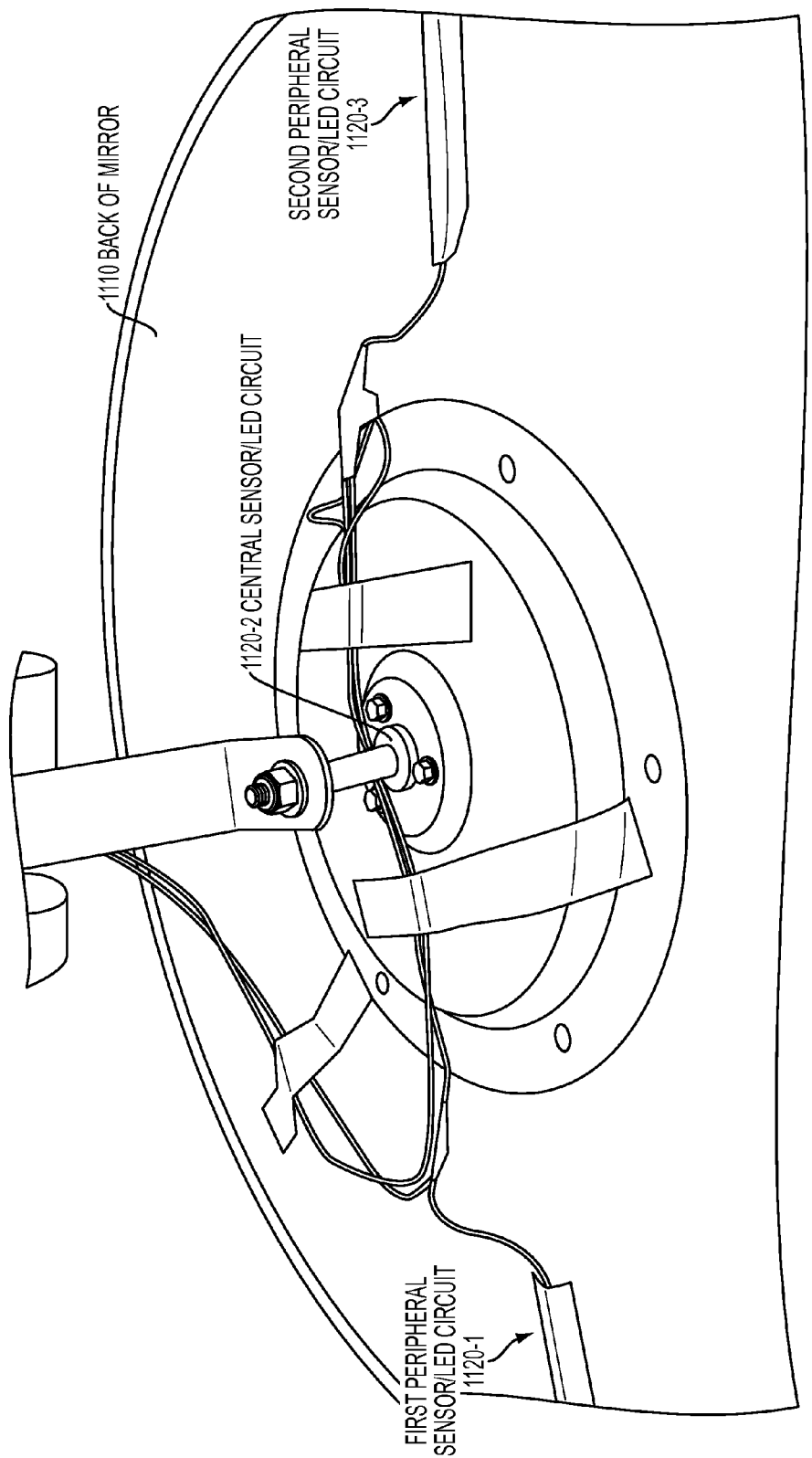
FIG. 11B shows the experimental prototype from the rear of the mirror showing the wiring of the three Hall-effect sensor circuits.

Referring to FIG. 11B, there is seen the reverse side of the mirror 110. Power wiring is shown to each Hall-effect sensor circuit 1120-1, 1120-2 and 1120-3. The power supply cord is seen at top going up the pole of to the handle area. The drilled hole for the circuit 1120-2 cannot be seen because it is underneath the mirror mount. The under-assembly wheels can be seen at top. If the mirror were not made of glass, a lighter weight plastic mirror may be substituted. For example, a convex All Industries, Chicago, Ill., SeeAll brand PLXO18 circular acrylic heavy duty mirror may cover an area up to 15 feet and so be sufficient for viewing an entire undercarriage of a typical vehicle. The extensible pole 1118, attached to such a mirror, may be hollow and manually lengthened so that the entire assembly could be easily lifted by a user to view a roof of a vehicle and locate a suspect magnetic field on a vehicle roof using two hands.

Figure 11C:
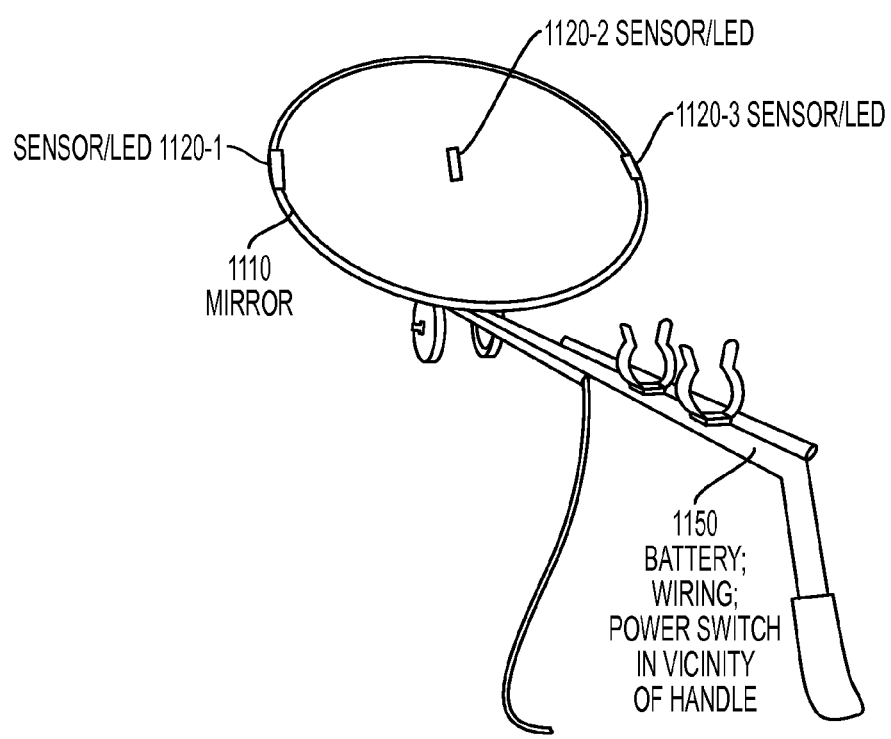
FIG. 11C shows the handle portion of the prototype mirror assembly where a battery power supply and on/off switch may be located.

Referring to FIG. 11C, a battery supply and power switch are shown being attached to the handle end of the prototype mirror assembly. The KY-024 Hall-effect sensor circuits may be seen on 18 inch diameter mirror 1110 as circuits 1120-1, 1120-2 and 1120-3. The KY-024 Hall-effect sensor circuit comprises a circuit similar to that of FIG. 9B except that it also includes an extra LED that indicates when power is supplied to the circuit. The three sensor circuit sensing LED's simulate a separate LED display 220 where the LED's are located at corresponding locations to corresponding Hall-effect sensor locations as per FIG. 2B.

Figure 11D:
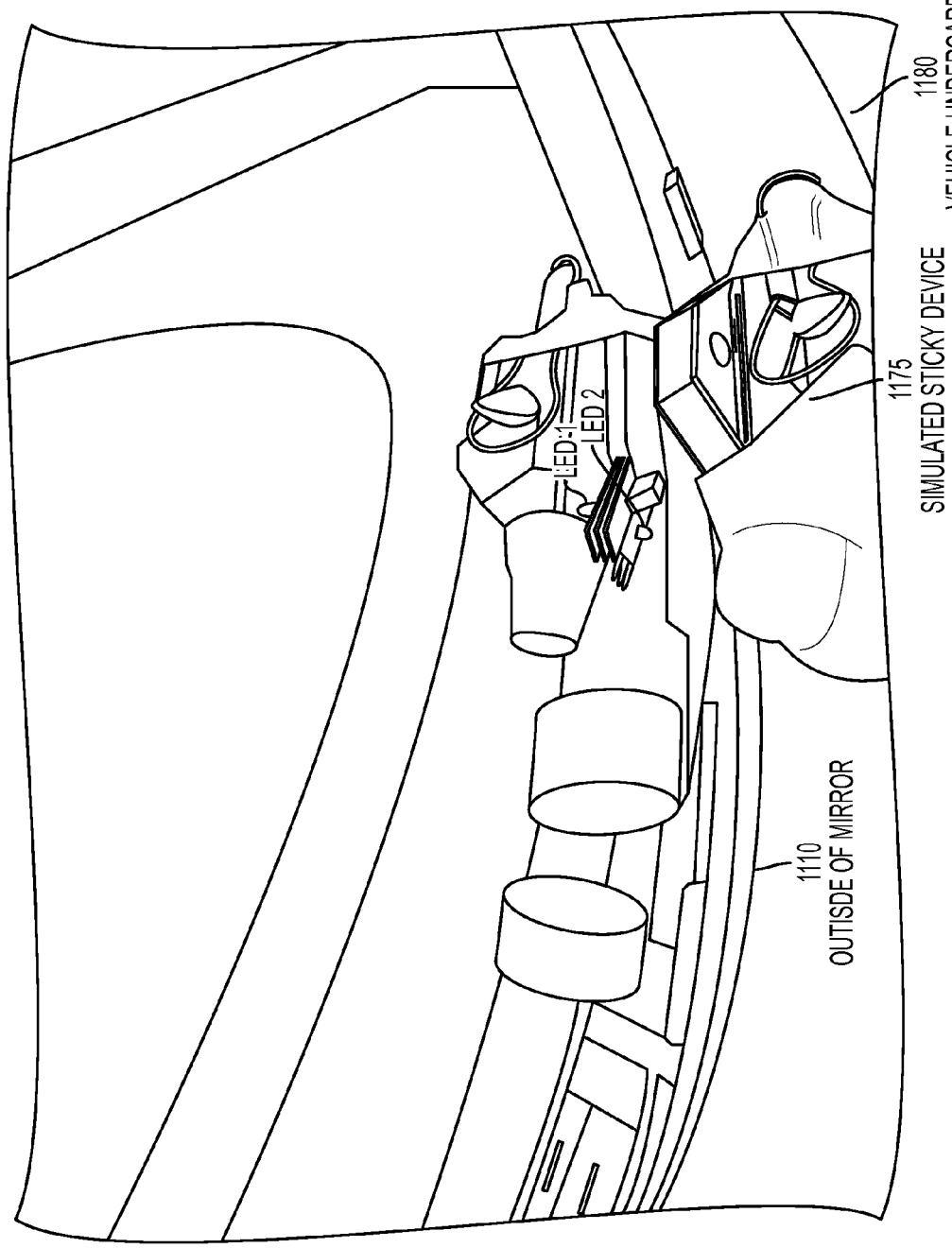
FIG. 11D shows the prototype mirror assembly being placed in the vicinity of a mock sticky device magnetically attached to a vehicle undercarriage wherein, due to the proximity of the sticky device to one of the three Hall-effect sensor circuits both a power indicator LED and a Hall-effect sensor magnetic field sensor LED are both illuminated.

Referring to FIG. 11D, a simulated sticky IED was attached by a magnet to a metallic frame of an automobile vehicle just at the side to the undercarriage. FIG. 11D shows a reflection in the mirror 1110 that both the power LED and Hall-effect sensor LED1, LED 2 are brightly lit when the peripheral sensor is brought proximate the mock sticky IED mounted to the vehicle frame. Similarly, not shown, the center mounted sensor LED was lit and the third, peripheral LED sequentially lit and unlit when the mirror was moved sideways, back and forth, under the undercarriage where the simulated sticky device was placed. Thus, the prototype proves the concept that a plurality of Hall-effect sensors and LED's may be utilized to form a display showing, for example, an outline of a sticky LED or any other sticky device. This same Hall-effect sensor prototype may be adapted for use with a flexible vertical roof strip, a vertical pole mounted Hall-effect sensor circuit, formed into an array for a wand and so on in related embodiments including an enhanced embodiment per FIG. 10.

While embodiments of this disclosure have been depicted, described, and are defined by reference to example embodiments of the disclosure, such references do not imply a limitation on the disclosure, and no such limitation is to be inferred. All patents referenced herein and all articles and textbooks shall be deemed to be incorporated herein as to their entirety. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

REFERENCES

Ernesto Londoño, 2008, "Use of 'Sticky IEDs' Rising in Iraq: Magnetized Devices Cling to Undersides of Vehicles," Washington Post Foreign Service, Thursday, Oct. 9, 2008.

Matthew P. H. O'Hara. 2009. "Detecting Improvised Explosive Devices in Urban Areas," US Navy, Wednesday, Apr. 1, 2009.

Edward Ranson, 2006, *Hall-Effect Sensors*, Elsevier, 2006.

What is claimed is:

1. A magnetic field sensor for detecting a magnetic field of a sticky device configured to adhere to a portion of a vehicle, the magnetic field sensor comprising:
   a plurality of Hall-effect sensors formed as an array of Hall-effect sensors for mounting across a pavement, a portion of the Hall-effect sensors being mounted on vertical, flexible, hollow poles to reach from the pavement toward a vehicle undercarriage, a vehicle crossing the array causing the array to output a vehicle magnetic field signature, the plurality of Hall-effect sensors coupled to a display for sensing the presence of a magnetic field of a sticky device when in proximity of the sticky device, the display comprising a plurality of elements corresponding in position to the respective positions of the plurality of Hall-effect sensors indicating the presence of the magnetic field of the sticky device, the plurality of Hall-effect sensors being located spatially distanced from one another and
   a power supply for powering the sensors and display elements.

2. The magnetic field sensor according to claim 1 comprising an N by M array of Hall-effect sensors and associated display elements such that an outline of the magnetic field of the sticky device may be displayed upon an actuation of a portion of the array of Hall-effect sensors, where N and M are each greater than one.

3. The magnetic field sensor according to claim 1, the plurality of Hall-effect sensors formed as a linear array of at least two axis Hall-effect sensors for mounting across the pavement.

4. The magnetic field sensor according to claim 3 further comprising a linear array of vertically oriented, flexible pole-mounted Hall-effect sensors coupled to a processor and memory for determining a location of the magnetic field of the sticky device upon comparison with the vehicle magnetic field signature.

5. The magnetic field sensor according to claim 3 further comprising:
   a memory for storing a vehicle magnetic field signature according to make, model and year of manufacture of the vehicle,
   a processor for distinguishing between a stored magnetic field signature and magnetic field data for the magnetic field of the sticky device, and
   a display for indicating the magnetic field of the sticky device.

6. The magnetic field sensor according to claim 5 further comprising:
   a camera for capturing images of the vehicle and storing the images of the vehicle according to year, make and model in the memory, the processor for receiving images of portions of a vehicle simultaneously with sensing the magnetic field and comparing the image portion with a stored vehicle image to determine a difference between the stored image and the image portion.

7. The magnetic field sensor according to claim 5 further comprising a wide band radio frequency receiver for receiving radio frequency emissions from the vehicle simultaneously with sensing the magnetic field.

8. The magnetic field sensor according to claim 1, the Hall-effect sensor comprising at least a two axis sensor, the axes being at a predetermined angle to one another.

9. The magnetic field sensor according to claim 1 in which first and second Hall-effect sensors of the plurality of Hall-effect sensors are mounted back-to-back to sense either North or South polarity of the magnetic field.

10. A magnetic field sensor for detecting a magnetic field of a sticky device, the magnetic field sensor comprising:
   a plurality of Hall-effect sensors coupled to a display for sensing the presence of a magnetic field of the sticky device when one of the plurality of Hall-effect sensors is proximate to the sticky device, the display comprising a plurality of display elements corresponding in relative position to the respective positions of the plurality of Hall-effect sensors, the one of the plurality of Hall-effect sensors sensing the presence of the magnetic field, and
   a mirror to which the plurality of Hall-effect sensors are mounted, the mirror for viewing a vehicle portion simultaneously with magnetic field sensing, the mirror having a centrally located Hall-effect sensor circuit.

11. The magnetic field sensor according to claim 10, the mirror being circular and adapted to reflect a wider portion of an object wider than a diameter of the circular mirror.

12. The magnetic field sensor of claim 10, the mirror being circular, the centrally located Hall-effect sensor circuit having two perimeter Hall-effect sensor circuits equally spaced on each side of the centrally located sensor circuit at the perimeter of the circular mirror.

13. The magnetic field sensor of claim 12, the circular mirror having six perimeter Hall-effect sensor circuits equally spaced around the centrally located Hall-effect sensor circuit.

14. The magnetic field sensor of claim 12 having a corresponding display of display elements to the centrally located Hall-effect sensor circuits and the two perimeter Hall-effect sensor circuits.

15. A magnetic field sensor for detecting a magnetic field of a sticky device configured to be attached to a vehicle, the magnetic field sensor comprising:
   a processor and
   a plurality of hall-effect sensors for detecting the presence of the magnetic field, the plurality of sensors for mounting linearly across a vehicle path and on a frame surrounding the sides and roof of the vehicle, the sensors collecting magnetic field data as a vehicle passes over the linearly mounted sensors and through the frame for comparison with expected magnetic field data for a particular make, model and year of manufacture of a vehicle, a portion of the sensors being mounted on vertically oriented flexible poles moveable to an identified vehicle height above the vehicle path by electric motors under control of the processor and operated responsive to a vehicle identification input via an input device to the processor.

16. The magnetic field sensor according to claim 15 further comprising:
   a camera for viewing vehicle portions from the vehicle path and located proximate the plurality of sensors and oriented to face upward.

17. The magnetic field sensor according to claim 15 further comprising:
   the plurality of Hall-effect sensors formed in a linear array,
   a memory for storing vehicle magnetic field signatures according to make, model and year of manufacture of the vehicle,
   the processor for distinguishing between a stored magnetic field signature and magnetic field data for a suspect magnetic field, and
   a display for indicating the suspect magnetic field.

18. The magnetic field sensor according to claim 17 wherein each of said Hall-effect sensors comprises at least a two axis sensor structure.

19. The magnetic field sensor of claim 15 further comprising a communications interface coupled to the processor for transmitting vehicle identity data and retrieving one of magnetic signature data and vehicle image data from a remote database.

20. The magnetic field sensor of claim 19 further comprising a camera for capturing a vehicle image for comparison via image segmentation to an image captured by the camera, the comparison resulting in automatically locating an anomaly.

* * * * *